(12) United States Patent
Hwang et al.

(10) Patent No.: US 12,426,263 B2
(45) Date of Patent: Sep. 23, 2025

(54) INTEGRATED CIRCUIT MEMORY DEVICES HAVING MULTI-PITCH CHANNEL COLUMNS THEREIN

(71) Applicant: Samsung Electronics Co., Ltd., Suwon-si (KR)

(72) Inventors: Sungmin Hwang, Hwaseong-si (KR); Jaejoo Shim, Suwon-si (KR); Bongtae Park, Seoul (KR); Taechul Jung, Hwaseong-si (KR); Jongyoon Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 481 days.

(21) Appl. No.: 17/747,462

(22) Filed: May 18, 2022

(65) Prior Publication Data
US 2022/0415915 A1 Dec. 29, 2022

(30) Foreign Application Priority Data
Jun. 23, 2021 (KR) ........................ 10-2021-0081253

(51) Int. Cl.
*H10B 43/10* (2023.01)
*H10B 41/10* (2023.01)
*H10B 41/27* (2023.01)
*H10B 43/27* (2023.01)

(52) U.S. Cl.
CPC ............ *H10B 43/10* (2023.02); *H10B 41/10* (2023.02); *H10B 41/27* (2023.02); *H10B 43/27* (2023.02)

(58) Field of Classification Search
CPC ................................ H10B 43/10; H10B 41/10
See application file for complete search history.

(56) References Cited

U.S. PATENT DOCUMENTS

| | | | |
|---|---|---|---|
| 9,391,087 B2 | 7/2016 | Shibata et al. | |
| 9,543,022 B2 | 1/2017 | Hashimoto et al. | |
| 9,929,174 B1 | 3/2018 | Mizutani et al. | |
| 10,804,283 B2 | 10/2020 | He et al. | |
| 2011/0298013 A1* | 12/2011 | Hwang | H10B 43/27 257/365 |

(Continued)

FOREIGN PATENT DOCUMENTS

| | | | | |
|---|---|---|---|---|
| KR | 10-2021-0076075 A | | 6/2021 | |
| WO | WO-2018080634 A1 * | | 5/2018 | ........ H01L 27/11565 |

*Primary Examiner* — Lex H Malsawma
*Assistant Examiner* — Bruce R. Smith

(57) ABSTRACT

Semiconductor device includes a substrate, gate electrodes stacked and spaced apart from each other in a first direction perpendicular to an upper surface of the substrate, separation regions penetrating the gate electrodes, extending in a second direction perpendicular to the first direction, and spaced apart from each other in a third direction perpendicular to the first direction and the second direction, channel structures arranged in columns in the third direction and rows in the second direction and penetrating the gate electrodes between the separation regions, and bit lines extending in the third direction on the channel structures. The channel structures include a first group of channel structures repeatedly arranged and including three columns arranged with a first pitch and a second pitch smaller than the first pitch in order, and the bit lines are arranged with at least one pitch smaller than the second pitch in the second direction.

19 Claims, 33 Drawing Sheets

(56) References Cited

U.S. PATENT DOCUMENTS

| | | | |
|---|---|---|---|
| 2017/0358593 A1* | 12/2017 | Yu ......................... | H10B 43/27 |
| 2018/0374961 A1* | 12/2018 | Kim ..................... | H10D 62/299 |
| 2019/0027434 A1* | 1/2019 | Jung ..................... | H10B 43/35 |
| 2019/0067182 A1* | 2/2019 | Lee ...................... | H10D 62/115 |
| 2022/0123004 A1* | 4/2022 | Liu ......................... | G11C 8/14 |

* cited by examiner

INTEGRATED CIRCUIT MEMORY DEVICES HAVING MULTI-PITCH CHANNEL COLUMNS THEREIN

CROSS TO REFERENCE TO RELATED APPLICATION(S)

This application claims benefit of priority to Korean Patent Application No. 10-2021-0081253 filed on Jun. 23, 2021 in the Korean Intellectual Property Office, the disclosure of which is incorporated herein by reference in its entirety.

BACKGROUND

Example embodiments of the present disclosure relate to a semiconductor device and a data storage system including the same.

There has been demand for a semiconductor device which may store high-capacity data in a data storage system including data storage. Accordingly, a measure for increasing data storage capacity of a semiconductor device has been studied. For example, as one method of increasing data storage capacity of a semiconductor device, a semiconductor device including memory cells arranged three-dimensionally, instead of memory cells arranged two-dimensionally, has been suggested.

SUMMARY

Example embodiments of the present disclosure provide a semiconductor device having improved mass productivity and reliability.

Example embodiments of the present disclosure provide a data storage system including a semiconductor device having improved mass productivity and reliability.

According to example embodiments of the present disclosure, a semiconductor device includes a substrate; gate electrodes stacked and spaced apart from each other in a first direction perpendicular to an upper surface of the substrate; separation regions penetrating the gate electrodes, extending in a second direction perpendicular to the first direction, and spaced apart from each other in a third direction perpendicular to the first direction and the second direction; an upper separation region extending in the second direction between two of the separation regions adjacent to each other in the third direction and penetrating a portion of the gate electrodes including an uppermost gate electrode; channel structures penetrating the gate electrodes between the two of the separation regions and each including a channel layer; first channel contacts disposed on the channel structures; second channel contacts connected to (e.g., electrically connected to) the first channel contacts; and bit lines connected to (e.g., electrically connected to) the second channel contacts and extending in the third direction, wherein the channel structures are arranged in first to third channel columns that extend in the third direction and are spaced apart from each other in the second direction, wherein the first channel column and the second channel column are arranged with a first pitch, and the second channel column and the third channel column are arranged with a second pitch different from the first pitch, and wherein the bit lines are arranged with a third pitch in the second direction, and wherein a sum of the first pitch and the second pitch is n times the third pitch, where n is a natural number.

According to example embodiments of the present disclosure, a semiconductor device includes a substrate; gate electrodes stacked and spaced apart from each other in a first direction perpendicular to an upper surface of the substrate; separation regions penetrating the gate electrodes, extending in a second direction perpendicular to the first direction, and spaced apart from each other in a third direction perpendicular to the first direction and the second direction. channel structures that are arranged in columns that extend in the third direction, are arranged in rows that extend in the second direction, and that are in the gate electrodes between the separation regions; and bit lines extending in the third direction on the channel structures, wherein the channel structures include a first group of channel structures repeatedly arranged and including three columns arranged with a first pitch and a second pitch smaller than the first pitch in order, and wherein the bit lines are arranged with at least one pitch smaller than the second pitch in the second direction.

According to example embodiments of the present disclosure; a data storage system includes a semiconductor storage device including a substrate, circuit devices disposed on one side of the substrate, and an input/output pad electrically connected to the circuit devices; and a controller electrically connected to the semiconductor storage device through the input/output pad and configured to control the semiconductor storage device, wherein the semiconductor storage device includes gate electrodes stacked and spaced apart from each other in a first direction perpendicular to an upper surface of the substrate; separation regions penetrating the gate electrodes, extending in a second direction perpendicular to the first direction, and spaced apart from each other in a third direction perpendicular to the first direction and the second direction; channel structures that are arranged in columns that extend in the third direction, are arranged in rows that extend in the second direction, and are in the gate electrodes between the separation regions; and bit lines extending in the third direction on the channel structures, wherein the channel structures are arranged in first to third channel columns forming a column that extend in the third direction and are spaced apart from each other in the second direction, wherein the first channel column and the second channel column are arranged with a first pitch, and the second channel column and the third channel column are arranged with a second pitch different from the first pitch, wherein the bit lines are arranged with a third pitch in the second direction, and wherein a sum of the first pitch and the second pitch is n times the third pitch, where n is a natural number.

BRIEF DESCRIPTION OF DRAWINGS

The above and other aspects, features, and advantages of the present invention will be more clearly understood from the following detailed description, taken in conjunction with the accompanying drawings, in which.

DETAILED DESCRIPTION

Hereinafter, example embodiments of the present invention will be described as follows with reference to the accompanying drawings.

Figure 1A:
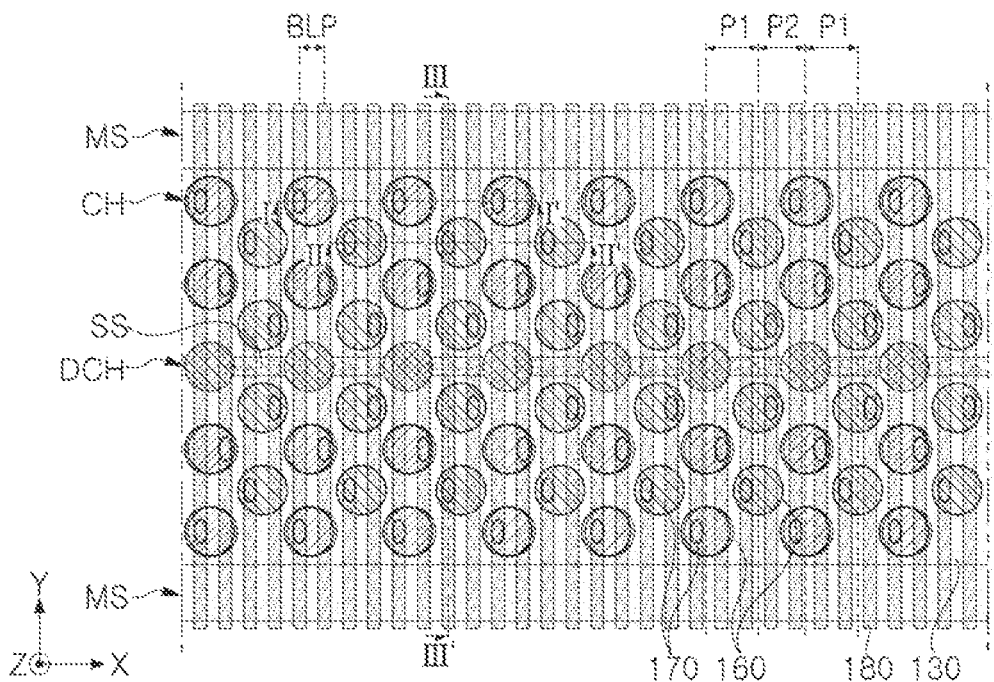
FIGS. 1A and 1B are plan views illustrating a semiconductor device according to an example embodiment of the present invention.
Figure 1B:
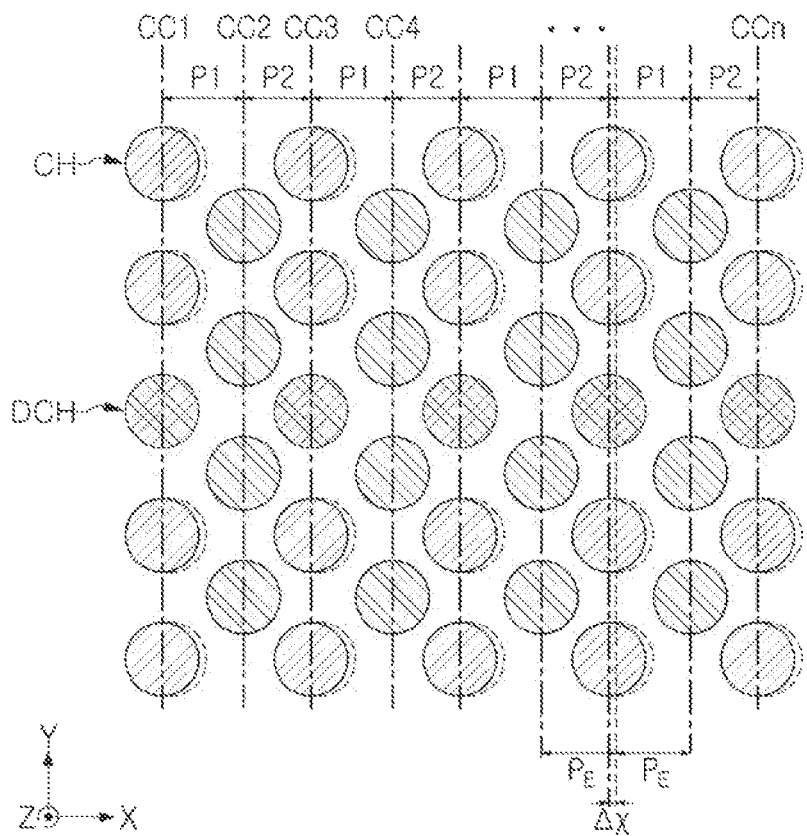

FIGS. 1A and 1B are plan views illustrating a semiconductor device according to an example embodiment. FIG. 1B illustrates only the channel structures in FIG. 1A.

Figure 2A:
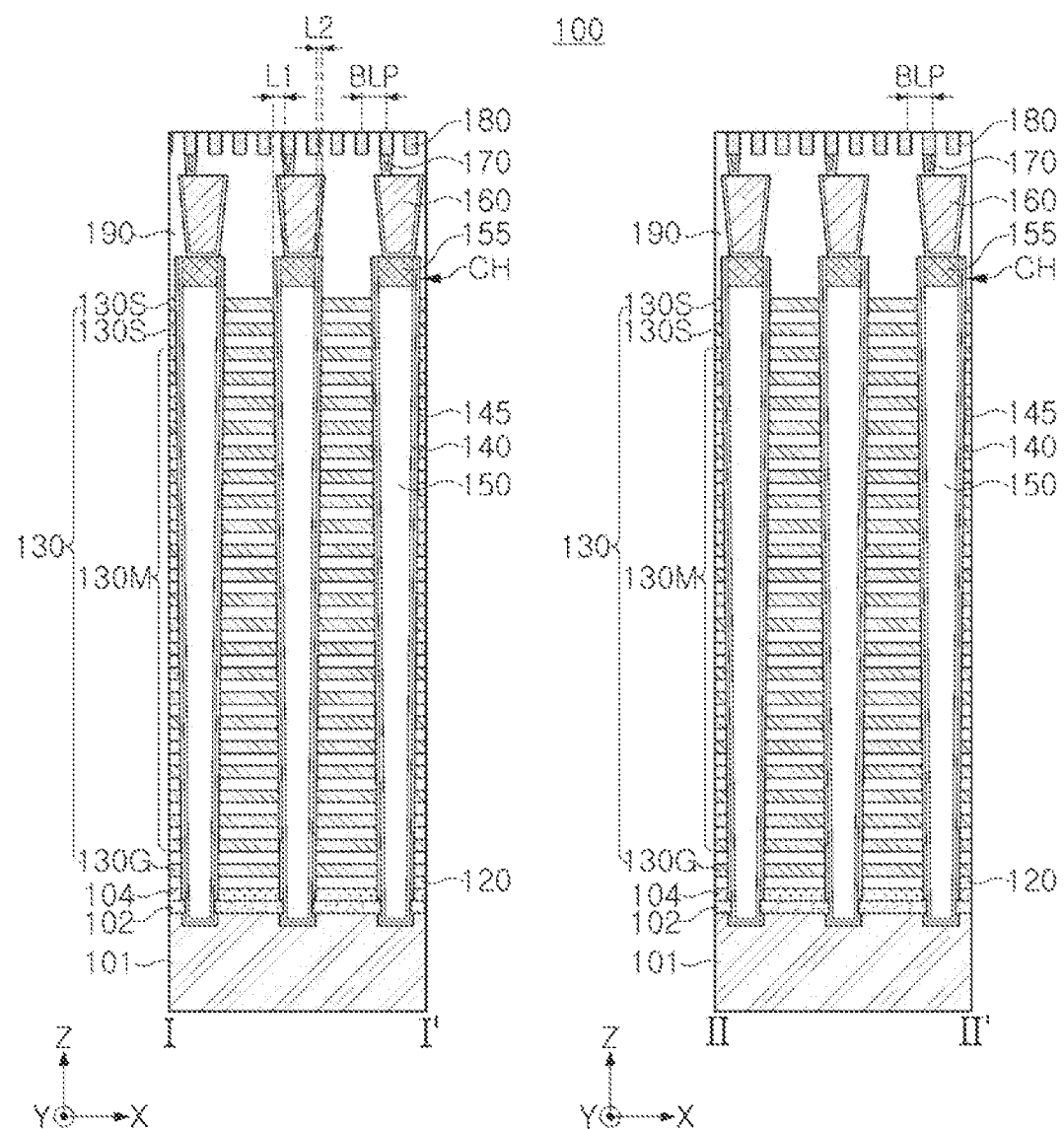
FIGS. 2A and 2B are cross-sectional views illustrating a semiconductor device according to an example embodiment of the present invention.
Figure 2B:
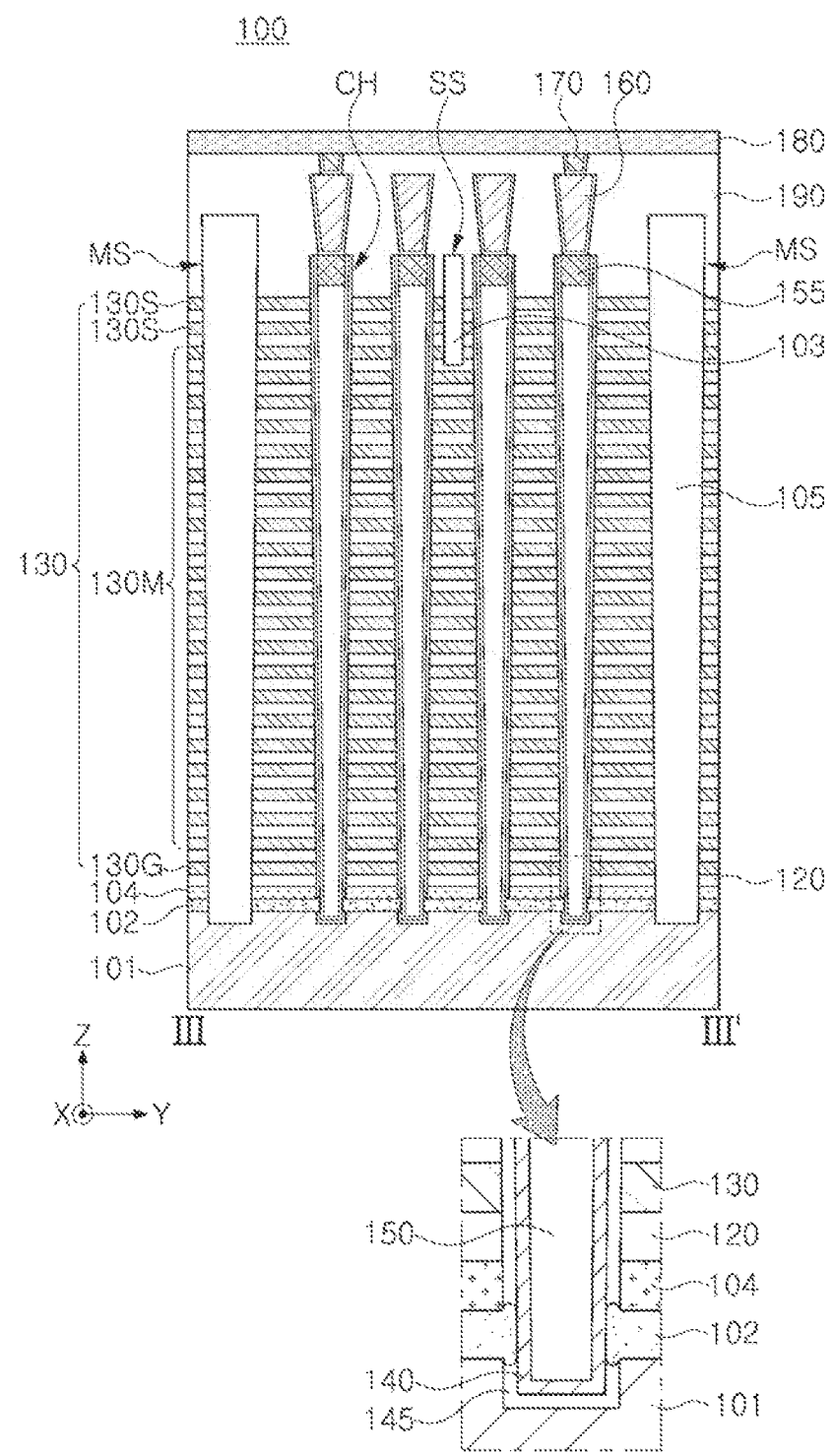

FIGS. 2A and 2B are cross-sectional views illustrating a semiconductor device according to an example embodiment. FIG. 2A illustrates a cross-sectional view taken along lines I-I' and II-II' in FIG. 1A. FIG. 2B is a cross-sectional view taken along line III-III' in FIG. 1A.

Referring to FIGS. 1A to 2B, a semiconductor device 100 may include a substrate 101, first and second horizontal conductive layers 102 and 104 on the substrate 101, gate electrodes 130 stacked on the substrate 101, interlayer insulating layers 120 alternately stacked with the gate electrodes 130 on the substrate 101, separation regions MS extending by penetrating a stack structure of the gate electrodes 130, channel structures CH disposed to penetrate (e.g., extend through) the stack structure of the gate electrodes 130 and each including a channel layer 140, first and second channel contacts 160 and 170 disposed in order on the channel structures CH, bit lines ISO connected to the second channel contacts 170, a cell region insulating layer 190 covering the gate electrodes 130 and the channel structures CH.

In the semiconductor device 100, a single memory cell string may be configured around each channel structure CH, and a plurality of memory cell strings may be arranged in columns and rows in the x direction and the y direction.

The substrate 101 may have an upper surface extending in the x direction and the y direction. The substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon on insulator (SOI) layer, a semiconductor on insulator (SeOI) layer, or the like.

The first and second horizontal conductive layers 102 and 104 may be stacked on the upper surface of the substrate 101. The first horizontal conductive layer 102 may function as at least a portion of a common source line of the semiconductor device 100, and, for example, as a common source line together with the substrate 101. As illustrated in the enlarged view in FIG. 2B, the first horizontal conductive layer 102 may be directly connected to the channel layer 140.

The first and second horizontal conductive layers 102 and 104 may include a semiconductor material, such as, for example, polycrystalline silicon. In this case, at least the first horizontal conductive layer 102 may be a layer doped with impurities of the same conductivity type as that of the substrate 101, and the second horizontal conductive layer 104 may be a doped layer or may include impurities diffused from the first horizontal conductive layer 102. However, the material of the second horizontal conductive layer 104 is not limited to the semiconductor material, and may include or may be an insulating layer in example embodiments.

The gate electrodes 130 may be vertically stacked and spaced apart from each other on the substrate 101 and may form a stack structure. The gate electrodes 130 may include a lower gate electrode 130G forming a gate of a ground select transistor, memory gate electrodes 130M forming a plurality of memory cells, and upper gate electrodes 130S forming gates of the string select transistors. The number of memory gate electrodes 130M forming the memory cells may be determined depending on capacity of the semiconductor device 100. According to an example embodiment, each of the upper and lower gate electrodes 130S and 130B may be one or two or more, and may have the same or different structure as that of the memory gate electrodes 130M. In example embodiments, the gate electrodes 130 may further include an erase gate electrode disposed above the upper gate electrodes and/or below the lower gate electrodes and forming an erase transistor used in an erase operation using a gate induced leakage current (GIDL). Also, a portion of the gate electrodes 130, the memory gate electrodes 130M adjacent to the upper or lower gate electrodes 130S and 130G, for example, may be dummy gate electrodes.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be disposed to be spaced apart from each other in a direction perpendicular to the upper surface of the substrate 101. The interlayer insulating layers 120 may include an insulating material such as silicon oxide or silicon nitride.

Each of the channel structures CH may form a single memory cell string, and may be spaced apart from each other on the substrate 101 while forming rows and columns. As illustrated in FIG. 1A, a portion of the channel structures CH may be dummy channel structures DCH. For example, the channel structures CH connected to the upper separation region SS may be dummy channel structures DCH. The dummy channel structures DCH may not function as an actual memory cell string in the semiconductor device 100. However, in example embodiments, the arrangement of the dummy channel structures DCH may be varied.

As illustrated in FIG. 1B, the channel structures CH may be disposed to form columns CC1-CCn in the y direction between a pair of separation regions MS adjacent to each other in the y direction. The channel columns CC1-CCn may be arranged to have a plurality of pitches in the x direction perpendicular to an extending direction of the bit lines 180. The term "pitch" may refer to a length or a distance between centers of elements in one direction or a spacing between the centers. In the example embodiment, the channel columns CC1-CCn may be arranged in an ABAB pattern in which a first pitch P1 and a second pitch P2 smaller than the first pitch P1 are alternately repeated in the x direction. In some embodiments, the first pitch P1 may be a distance in the x direction between a center or a center line of the channel column CC1 and a center of the channel column CC2, and the second pitch P2 may be a distance in the x direction between a center of the channel column CC2 and a center of the channel column CC3 as illustrated in FIG. 1B. The center of each of the channel columns CC1, CC2 and CC3 may extend along centers of the channel structures CH in the x direction. The extending direction of the bit lines 180 may be a direction (i.e., the y direction in FIG. 1A) in which each of the bit lines 180 extends longitudinally.

For example, in the channel columns CC1-CCn, odd-numbered columns may be shifted and arranged by a predetermined length Δx from equally spaced pitches $P_E$ arranged with an equal distance therebetween. Accordingly, the first pitch P1 may be greater than the equally spaced pitch $P_E$, the second pitch P2 may be smaller than the equally spaced pitch $P_E$, and a difference between the first pitch P1 and the second pitch P2 may be, for example, in the range of about 0.2 nm to about 20 nm, for example, in the range of about 2 nm to about 10 nm. However, in example embodiments, the shifted columns may be even-numbered columns, and accordingly, the relative sizes of the first pitch P1 and the second pitch P2 may also be changed. As used herein the term "shifted" may be interchangeable with "offset."

The sum of the first pitch P1 and the second pitch P2 may correspond to twice the equally spaced pitch $P_E$. The equally spaced pitch $P_E$ may be configured as a pitch determined to correspond to the bit line pitch BLP of the bit lines 180 on the channel structures CH. For example, when n number of bit lines 180 are disposed on each of the channel columns CC1-CCn, the equally spaced pitch $P_E$ may be n times the bit line pitch BLP. Accordingly, the sum of the first pitch P1 and the second pitch P2 may be n times the bit line pitch BLP (n is a natural number). Specifically, as in the example embodiment, when two bit lines 180 are disposed on each of the channel columns CC1-CCn, the equally spaced pitch $P_E$ may be twice the bit line pitch BLP. Accordingly, the sum of the first pitch P1 and the second pitch P2 may be 2n times the bit line pitch BLP, or four times the bit line pitch BLP, for example, and each of the first pitch P1 and the second pitch P2 may be greater than the bit line pitch BLP.

In the example embodiment, by shifting and arranging a portion of columns of the channel structures CH, the pitch between the columns of the channel columns CC1-CCn may be varied. Accordingly, in the process of removing the sacrificial insulating layers 118 and the process of forming the gate electrodes 130, described below with reference to FIGS. 15C and 15D, a passage of an etchant and/or a deposition material supplied from openings OP corresponding to the separation regions MS may be secured, such that the processes may be easily performed, and defects may be reduced.

The channel structures CH may have a columnar shape, and may have inclined side surfaces having a width decreasing toward the substrate 101 depending on an aspect ratio. As illustrated in the enlarged view in FIG. 2B, each of the channel structures CH may include a gate dielectric layer 145, a channel filling insulating layer 150 disposed between the channel layers 140, and a channel pad 155 on an upper end, in addition to the channel layer 140.

The channel layer 140 may be formed in an annular shape surrounding the internal channel filling insulating layer 150, but in example embodiments, the channel layer 140 may have a columnar shape such as a cylindrical shape or a prism shape without the channel filling insulating layer 150. The channel layer 140 may be connected to the first horizontal conductive layer 102 on a lower portion. The channel layer 140 may include a semiconductor material such as polycrystalline silicon or single crystal silicon, and the semiconductor material may be an undoped material or a material including p-type or n-type impurities.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The channel pads 155 may be disposed on an upper end of the channel layer 140 in the channel structures CH. The channel pads 155 may be disposed to cover the upper surface of the channel filling insulating layer 150, to be in contact with the channel layer 140 through a side surface, and to be electrically connected to the channel layer 140, The channel pads 155 may include, for example, doped polycrystalline silicon.

The upper separation regions SS may extend in the x direction between the separation regions MS adjacent to each other in the y direction. The upper separation regions SS may be disposed to penetrate (e.g., extend through) a portion of the gate electrodes 130 including an uppermost gate electrode 130 among the gate electrodes 130. As illustrated in FIG. 2B, the upper separation regions SS may separate three gate electrodes 130 from each other in the y direction, for example. However, the number of gate electrodes 130 separated by the upper separation regions SS may be varied in example embodiments. The upper separation regions SS may include an upper separation insulating layer 103. In some example embodiments, the upper separation regions SS may be disposed to penetrate through the dummy channel structures DCH and to continuously extend.

The separation regions MS may extend by penetrating the gate electrodes 130, the interlayer insulating layers 120, and the first and second horizontal conductive layers 102 and 104 in the x direction, and may be connected to the substrate 101. As illustrated in FIG. 1A, the separation regions MS may be disposed parallel to each other. The separation regions MS may separate the gate electrodes 130 from each other in the y direction. The separation regions MS may have a shape in which a width decreases toward the substrate 101 due to a high aspect ratio. The separation regions MS may include a separation insulating layer 105 disposed in a trench.

The first and second channel contacts 160 and 170 may be stacked in order on the channel structures CH. The first and second channel contacts 160 and 170 may have a cylindrical shape, and may have an inclined side surface having a width decreasing toward the substrate 101 depending on an aspect ratio. The first channel contacts 160 may have a length longer than that of the second channel contacts 170, but an example embodiment thereof is not limited thereto. In the example embodiment, columns of the first and second channel contacts 160 and 170 along the y direction may be disposed with equal distances therebetween in the x direction. For example, columns of the first channel contacts 160 may be arranged with the equally spaced pitch $P_E$, and columns of the second channel contacts 170 may be arranged with the bit line pitches BLP.

The first channel contacts 160 may be disposed on the channel structures CH to be in contact with the channel pads 155 of the channel structures CH. The first channel contacts 160 may not be disposed on the dummy channel structures DCH. However, in some example embodiments, the first channel contacts 160 may be disposed on the dummy channel structures DCH, and the second channel contacts 170 may not be disposed on the dummy channel structures DCH. Upper surfaces of the first channel contacts 160 may have the same size as or a similar size to those of the upper surfaces of the channel structures CH, but an example embodiment thereof is not limited thereto. In the example embodiment, since columns of the first channel contacts 160 along the y direction may be disposed with an equal distance therebetween, a portion of the lower channel structures CH may be shifted from the first channel contacts 160, and the other portion may be aligned such that centers thereof in the x direction may match (e.g., may be aligned with) centers (e.g., centers in the x direction) of the first channel contacts 160.

Specifically, as illustrated on the left in FIG. 2A, the first channel contacts 160 may be shifted from the channel structures CH in alternately disposed channel columns CC1-CCn, for example, the channel structures CH in odd-numbered columns, among the channel structures CH. The channel structures CH in the odd-numbered columns may be the shifted channel structures CH described above with reference to FIG. 1B. Accordingly, a length L1 from one end of the first channel contact 160 to one end of adjacent channel structure CH may be different from a second length L2 from the other end of the first channel contact 160 to one end of adjacent channel structure CH, on the upper surface of the channel structure CH. As illustrated on the right in FIG. 2A, the first channel contacts 160 may be aligned such that centers thereof in the x direction may match may be aligned with) centers (e.g., centers in the x direction) of the channel structures CH in even-numbered columns.

As illustrated in FIG. 1A, the second channel contacts 170 may be disposed to be connected to the first channel contacts 160 on one side of each of the first channel contacts 160. The second channel contacts 170 may be disposed between the first channel contacts 160 and the bit lines 180, and may be aligned such that centers thereof in the x direction may match (e.g., may be aligned with) centers (e.g., centers in the x direction) of the bit lines 180. The second channel contacts 170 may have a shape such as an elliptical shape or an elongated shape having a long axis in the y direction, the extending direction of the bit line 180, on a plan view. For example, the second channel contacts 170 may have a diameter or width smaller than those of the first channel contacts 160.

The first and second channel contacts 160 and 170 may be formed of a conductive material, and may include at least one of tungsten (W), aluminum (Al), and copper (Cu), for example.

The bit lines 180 may be connected to the second channel contacts 170 and may extend in the y direction. Two bit lines 180 may extend in parallel on each of the channel columns CC1-CCn. In the example embodiment, the bit line pitch BLP of the bit lines 180 may be a constant value, and as described above, n times or 2n times the bit line pitch BLP may be equal to the sum of different pitches of the channel structures CH. As illustrated in FIG. 2B, one bit line 180 may be electrically connected to one of the channel structures CH between the separation region MS and the upper separation region SS in the y direction. The bit lines 180 may be formed of a conductive material, and may include at least one of tungsten (W), aluminum (Al), and copper (Cu), for example.

In the example embodiment, while the pitch of the channel structures CH may be varied, the interconnection structures such as the first and second channel contacts 160 and 170 and the bit lines 180 on the channel structures CH may be disposed the same as in the case in which the channel structures CH are arranged with the equally spaced pitch $P_E$. Accordingly, only the channel structures CH and the first channel contacts 160, having a relatively large process margin, may be partially shifted and connected, such that the example embodiment may be implemented without increasing process difficulty.

In example embodiments, the structure of the interconnection structure such as the first and second channel contacts 160 and 170 disposed between the channel structures CH and the bit lines 180 may be varied. For example, an interconnection line may be further disposed between the first and second channel contacts 160 and 170.

The cell region insulating layer 190 may be disposed to cover the gate electrodes 130 and the channel structures CH. The cell region insulating layer 190 may include a plurality of insulating layers in example embodiments. The cell region insulating layer 190 may be formed of an insulating material, and may include, for example, at least one of silicon oxide; silicon nitride, and silicon oxynitride.

Figure 3A:
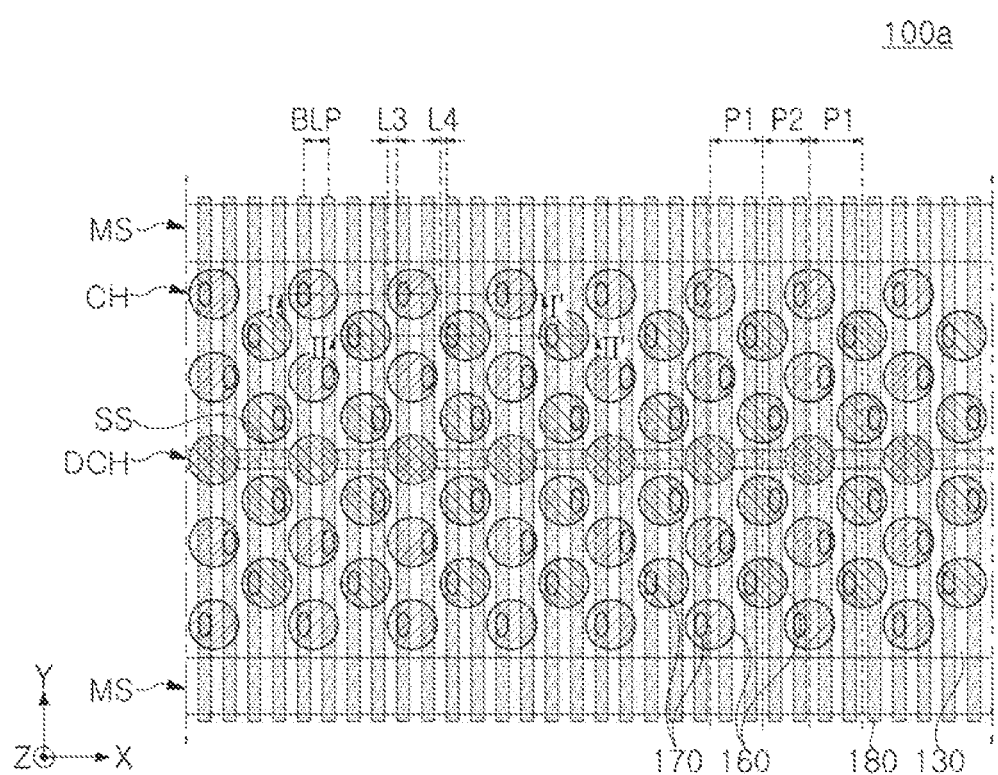
FIGS. 3A and 3B are a plan view and a cross-sectional view illustrating a semiconductor device according to an example embodiment of the present invention.
Figure 3B:
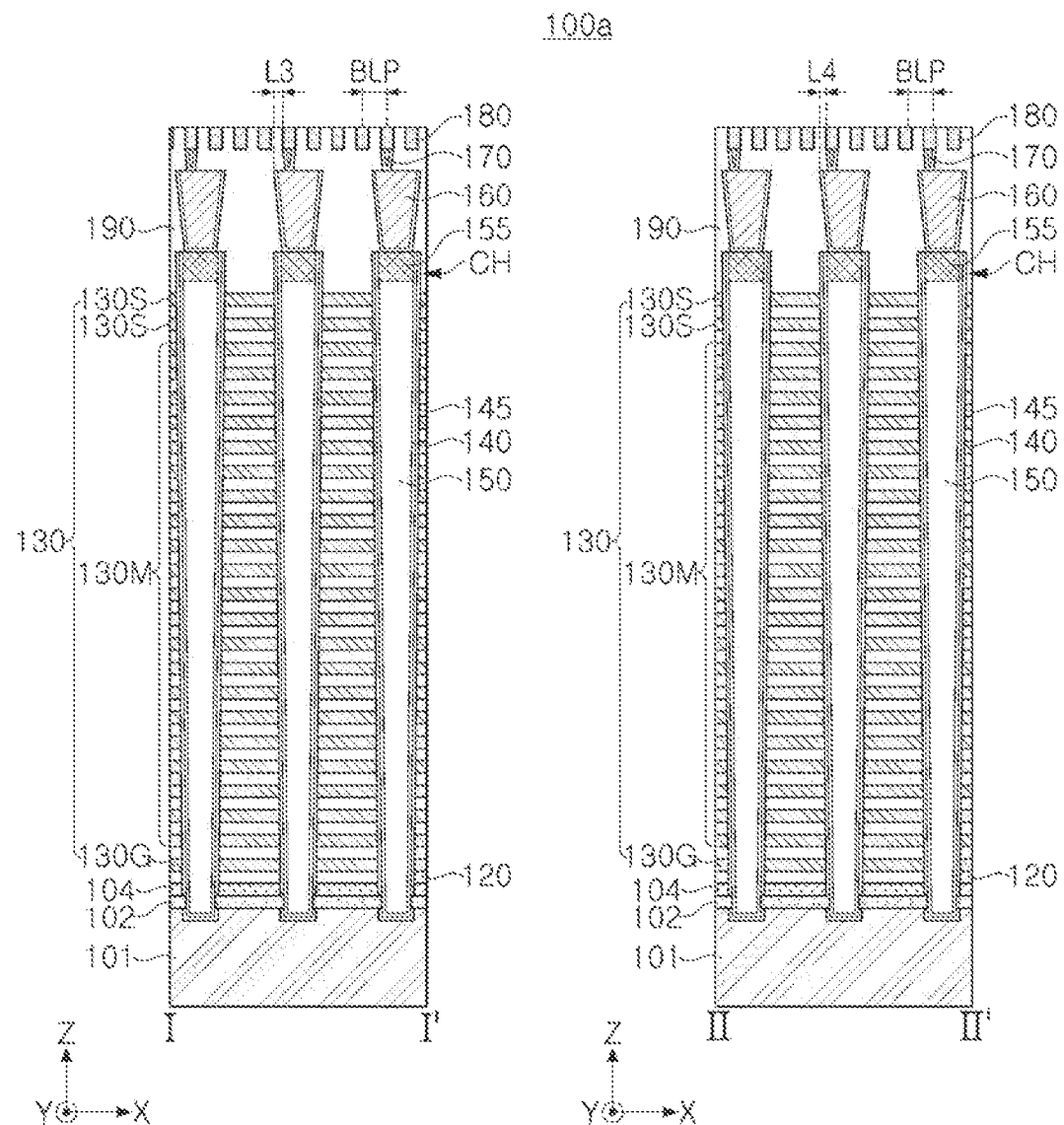

FIGS. 3A and 3B are a plan view and a cross-sectional view illustrating a semiconductor device according to an example embodiment, illustrating regions corresponding to FIGS. 1A and 2A, respectively.

Referring to FIGS. 3A and 3B, in a semiconductor device 100a, a portion of columns of the first channel contacts 160 may be shifted together with the channel structures CH. Accordingly, similarly to the channel structures CH, the first channel contacts 160 may be disposed to have two first and second pitches P1 and P2 in which columns along the y direction are alternately repeated in the x direction. The first channel contacts 160 may be arranged in first channel contact columns that extend in the y direction. Three of the first channel contact columns may be arranged with the first pitch P1 and the second pitch P2 in the x direction, and these three of the first channel contact columns (e.g., centers of the three of the first channel contact columns) may be aligned with underlying channel columns (e.g., centers of underlying channel columns), respectively, as illustrated in FIG. 3A.

As illustrated in FIG. 3B, the first channel contacts 160 may be arranged such that centers in the x direction may match (e.g., may be aligned with) centers (e.g., centers in the x direction) of the entire channel structures CH including the shifted channel structures CH. The second channel contacts 170 may have different positions on odd-numbered columns and even-numbered columns of the channel structures CH and the first channel contacts 160. For example, as illustrated on the left in FIG. 3B, the second channel contacts 170 may be disposed relatively adjacent to centers of the first channel contacts 160 on the first channel contacts 160 in odd-numbered columns, and as illustrated on the right in FIG. 3B, the second channel contacts 170 may be disposed relatively adjacent to ends of the first channel contacts 160 on the first channel contacts 160 in even-numbered columns. For example, a spacing distance L3 from the end of the first channel contact 160 to the second channel contact 170 on the first channel contacts 160 in the odd-numbered columns may be greater than a spacing distance L4 from the end of the first channel contacts 160 to the second channel contact 170 on the first channel contacts 160 in the even-numbered columns. The bit lines 180 may be disposed such that centers thereof in the x direction may match (e.g., may be aligned with) centers (e.g., centers in the x direction) of the second channel contacts 170 as in the example embodiment in FIGS. 1A to 2B.

In the example embodiment, as the pitches of the channel structures CH are varied, the first channel contacts 160 of the interconnection structure may be disposed to correspond to the channel structures CH, and the second channel contacts 170 and the bit lines 180 of the interconnection structure may be disposed in the same manner as in the case in which the channel structures CH are arranged with the equally spaced pitch $P_E$. The structure may be determined in consideration of an alignment margin between the channel structures CH and the components of the interconnection structure connected to each other, and patterning difficulty of each component.

Figure 4A:
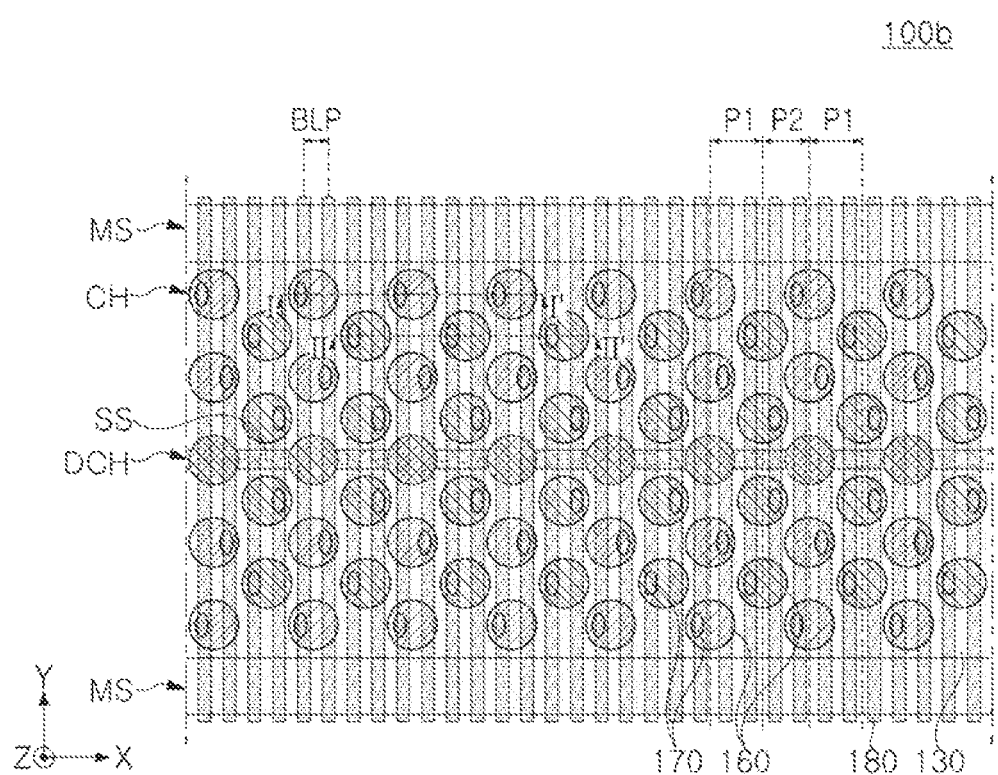
FIGS. 4A and 4B are a plan view and a cross-sectional view illustrating a semiconductor device according to an example embodiment of the present invention.
Figure 4B:
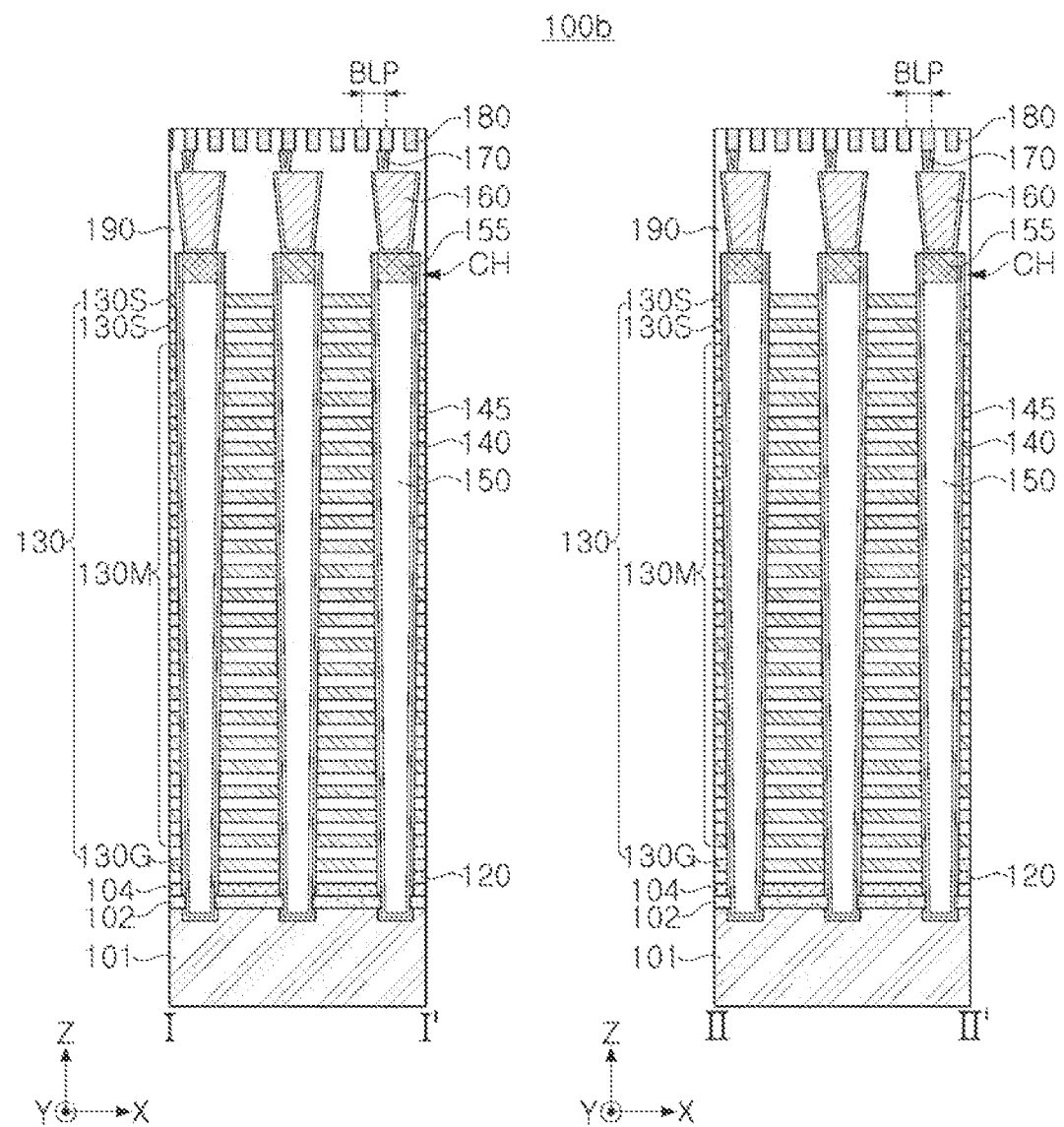

FIGS. 4A and 4B are a plan view and a cross-sectional view illustrating a semiconductor device according to an example embodiment, illustrating regions corresponding to FIGS. 1A and 2A, respectively.

Referring to FIGS. 4A and 4B, in a semiconductor device 100b, a portion of columns of the first and second channel contacts 160 and 170 may be shifted together with the channel structures CH. Accordingly, similarly to the channel structures CH, the first channel contacts 160 may be arranged to have two first and second pitches P1 and P2 in which columns along the y direction are alternately repeated in the x direction. The second channel contacts 170 may be arranged such that columns along the y direction may have two or more pitches in the x direction, or three pitches repeated in the form of ABAC, for example.

As illustrated in FIG. 4B, the first channel contacts 160 may be arranged such that centers in the x direction may match (e.g., may be aligned with) centers (e.g., centers in the x direction) of the entire channel structures CH including the shifted channel structures CH. The second channel contacts 170 may be arranged adjacent to ends of the first channel contacts 160 with a predetermined pattern on the first channel contacts 160. The bit lines 180 may be shifted from centers of the second channel contacts 170 on a portion of the second channel contacts 170, as illustrated on the left in FIG. 4B, and may be arranged such that centers (e.g., centers in the x direction) thereof may match (e.g., may be aligned with) centers (e.g., centers in the x direction) of the second channel contacts 170 on the other the second channel contacts 170, as illustrated on the right in FIG. 4B.

In the example embodiment, as the pitches of the channel structures CH are varied, the first and second channel contacts 160 and 170 of the interconnection structures may be disposed to correspond to the channel structures CH, and the bit lines 180 of the interconnection structures may be disposed in the same manner as in the case in which the channel structures CH are arranged with the equally spaced pitch $P_E$. The structure may be determined in consideration of an alignment margin between the channel structures CH and the components of the interconnection structure connected to each other, and patterning difficulty of each component.

Figure 5A:
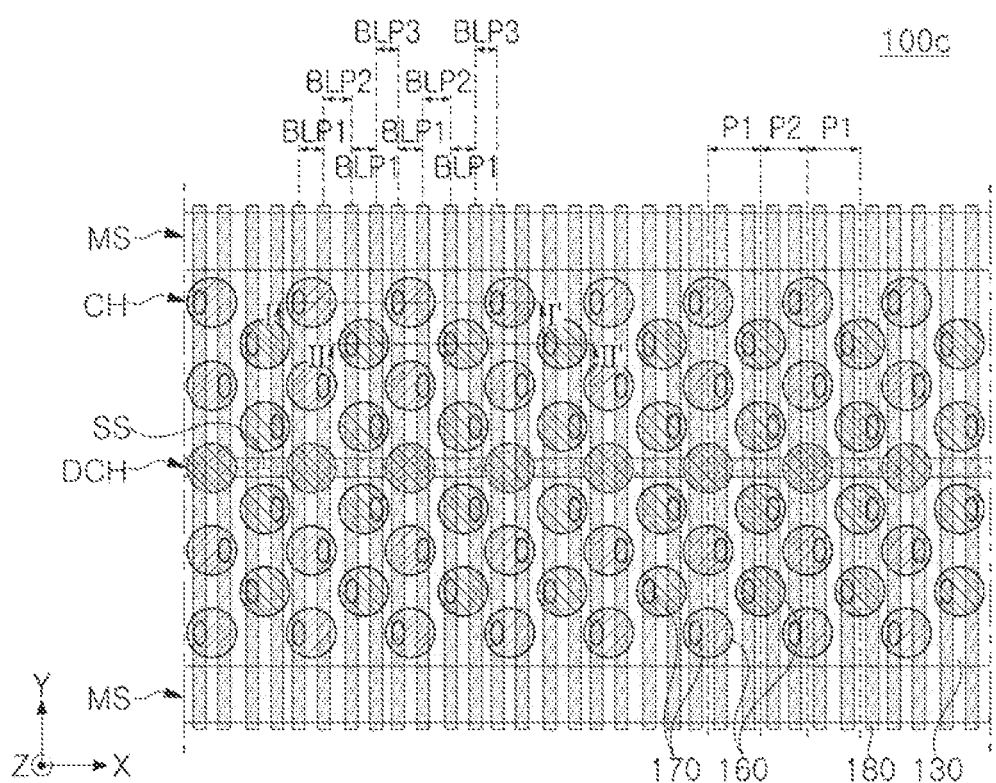
FIGS. 5A and 5B are a plan view and a cross-sectional view illustrating a semiconductor device according to an example embodiment of the present invention.
Figure 5B:
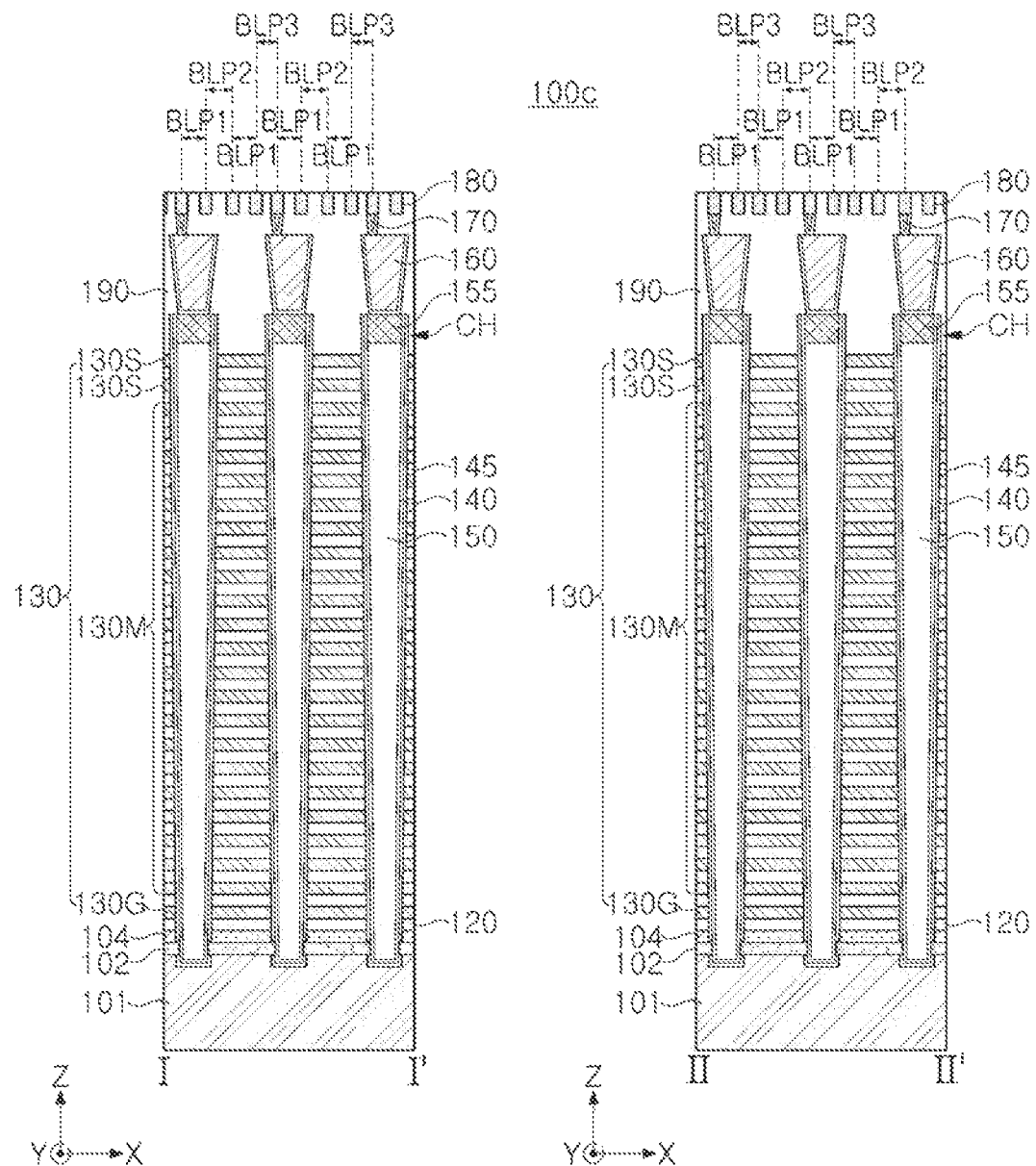

FIGS. 5A and 5B are a plan view and a cross-sectional view illustrating a semiconductor device according to an example embodiment, illustrating regions corresponding to FIGS. 1A and 2A, respectively.

Referring to FIGS. 5A and 5B, in a semiconductor device 100c, a portion of columns of the first and second channel contacts 160 and 170 and the bit lines 180 may be shifted together with the channel structures CH. Accordingly, similarly to the channel structures CH, the first channel contacts 160 may be arranged to have two first and second pitches P1 and P2 in which columns along the y direction are alternately repeated in the x direction. The second channel contacts 170 may be arranged such that columns along the y direction may have two or more pitches in the x direction, or three pitches repeated in the form of ABAC, for example.

The bit lines 180 may also be arranged to have three first to third bit line pitches BLP1, BLP2, and BLP3 repeated in the x direction, such as, for example, in the form of ABAC, similarly to the second channel contacts 170. The first bit line pitch BLP1 may be smaller than the second bit line pitch BLP2 and may be greater than the third bit line pitch BLP3. In example embodiments, the bit lines 180 disposed as above may be formed by; for example, quadruple patterning technology (QPT), one of multi-patterning techniques. In this case, the relative sizes of the first to third bit line pitches BLP1, BLP2, and BLP3 are not limited to the example embodiment, and may be varied.

As illustrated in FIG. 5B, the first channel contacts 160 may be arranged such that centers thereof in the x direction may match (e.g., may be aligned with) centers (e.g., centers in the x direction) of the entire channel structures CH including the shifted channel structures CH. The second channel contacts 170 may be arranged to be adjacent to the ends of the first channel contacts 160 in a predetermined pattern on the first channel contacts 160. The bit lines 180 may be aligned such that the centers (e.g., centers in the x direction) thereof may match (e.g., may be aligned with) centers (e.g., centers in the x direction) of the second channel contacts 170.

In the example embodiment, as the pitches of the channel structures CH are varied, the first and second channel contacts 160 and 170 and the bit lines 180 forming the interconnection structure may be disposed to correspond to the channel structures CH. The structure may be determined in consideration of an alignment margin between the channel structures CH and the components of the interconnection structure connected to each other, and patterning difficulty of each component.

Figure 6A:
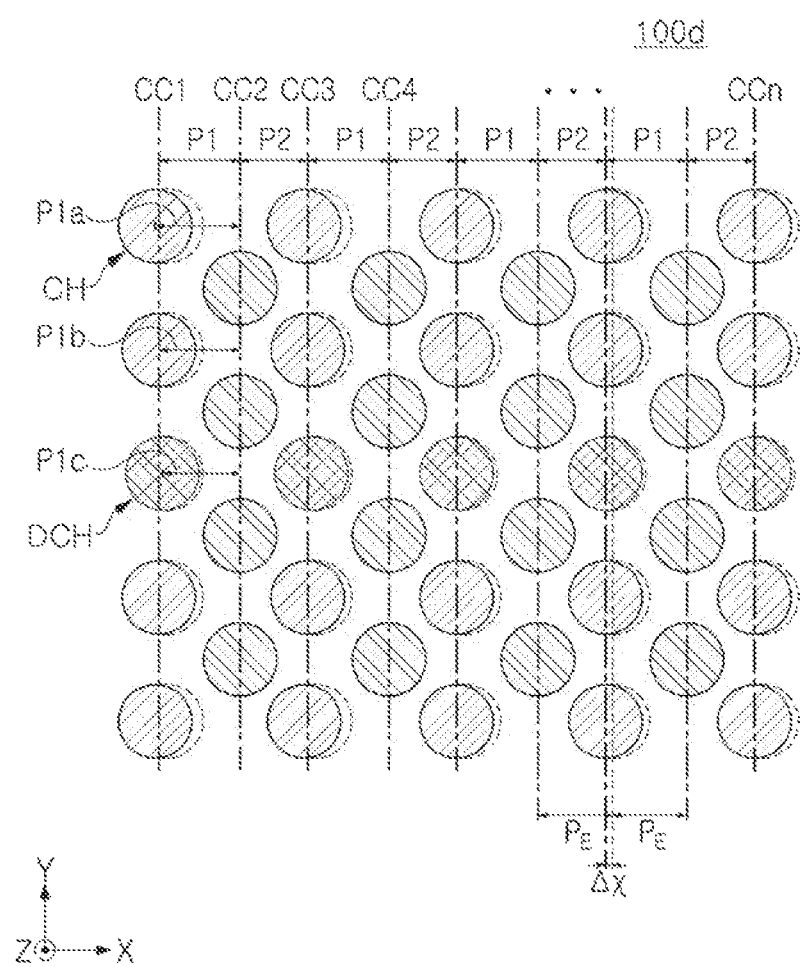
FIGS. 6A and 6B are plan views illustrating a semiconductor device according to an example embodiment of the present invention.
Figure 6B:
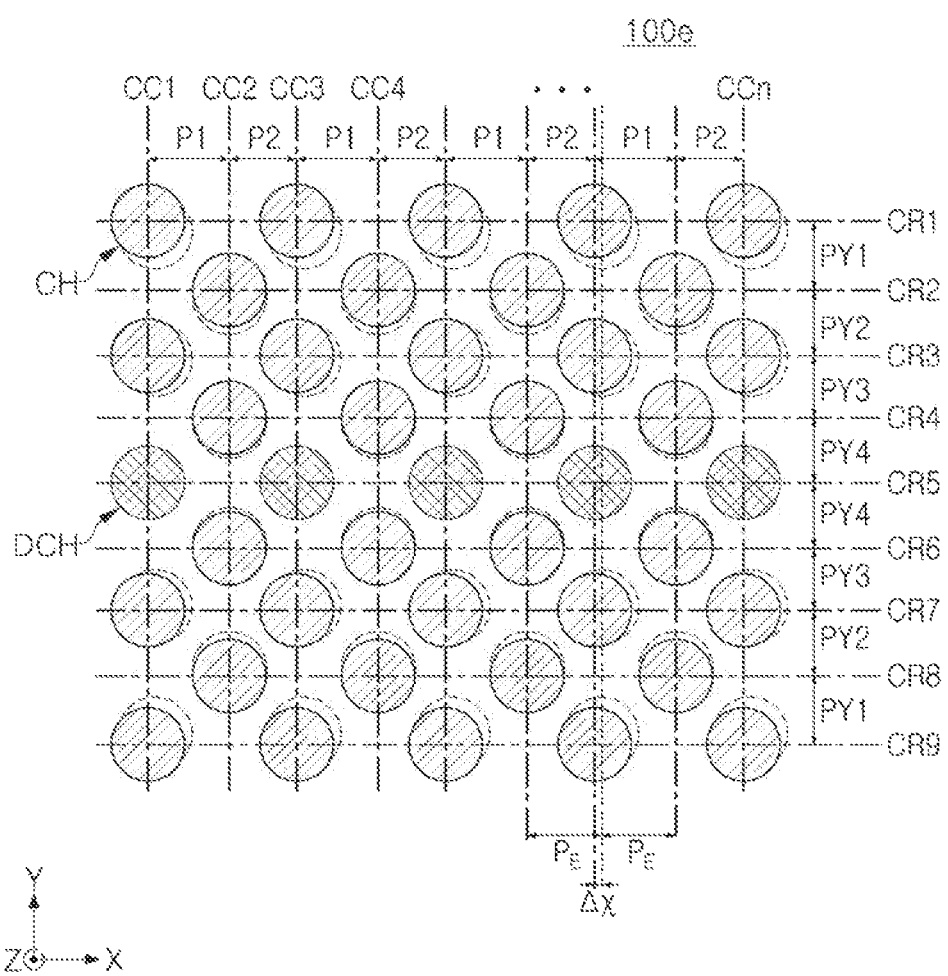

FIGS. 6A and 6B are plan views illustrating a semiconductor device according to an example embodiment, illustrating regions corresponding to FIG. 1B.

Referring to FIG. 6A, in a semiconductor device 100d, as for the channel structures CH, in the shifted channel columns among the channel columns CC1-CCn, the degree in which the channel structures CH in each row along the x direction are shifted may be varied, differently from the example embodiment in FIG. 1B.

For example, in the first channel column CC1, which is an odd-numbered column, the channel structures CH in the rows on both ends most adjacent to (e.g., in the rows closest to) the separation region MS (see FIG. 1A) may have a first modified pitch P1a with an adjacent second channel column CC2, the channel structures CH in inner rows may have a second modified pitch P1b smaller than the first modified pitch P1a, and the channel structure CH in the central row may have a third modified pitch P1c smaller than the second modified pitch P1b. The channel structures CH may be symmetrically disposed in the y direction with respect to the dummy channel structures DCH. One of the first to third modified pitches P1a, P1b, and P1c may be the same as the first pitch P1, but an example embodiment thereof is not limited thereto.

In some example embodiments, the channel structures CH in non-shifted channel columns among the channel columns CC1-CCn, such as, for example, the even-numbered columns, may have different modified pitches depending on rows.

Referring to FIG. 6B, in a semiconductor device 100e, the channel structures CH also in the channel rows CR1-CR9 may be arranged with a plurality of first to fourth pitches PY1, PY2, PY3, and PY4 in the y direction, differently from the example embodiment in FIG. 1B.

For example, the channel rows CR1-CR9 may be arranged such that a pitch therebetween may increase toward the separation region MS (see FIG. 1A) with respect to the center row CR5. Accordingly, the first to fourth pitches PY1, PY2, PY3, and PY4 may have sizes decreasing in order. In the example embodiment, as the pitches of the channel structures CH in the y direction, the direction perpendicular to the separation region MS and the extending direction of the bit lines 180 (see FIG. 1A), are also varied, a passage of an etchant and/or a deposition material supplied from openings OP (see FIG. 15C) corresponding to the separation regions MS may be additionally secured.

However, the number, the relative size, and the arrangement pattern of the pitches with which the channel rows CR1-CR9 are arranged may be varied in example embodiments. Also, the structure in which the channel structures CH are arranged with a plurality of pitches in the y direction as in the example embodiment may also be applied to other example embodiments.

Figure 7A:
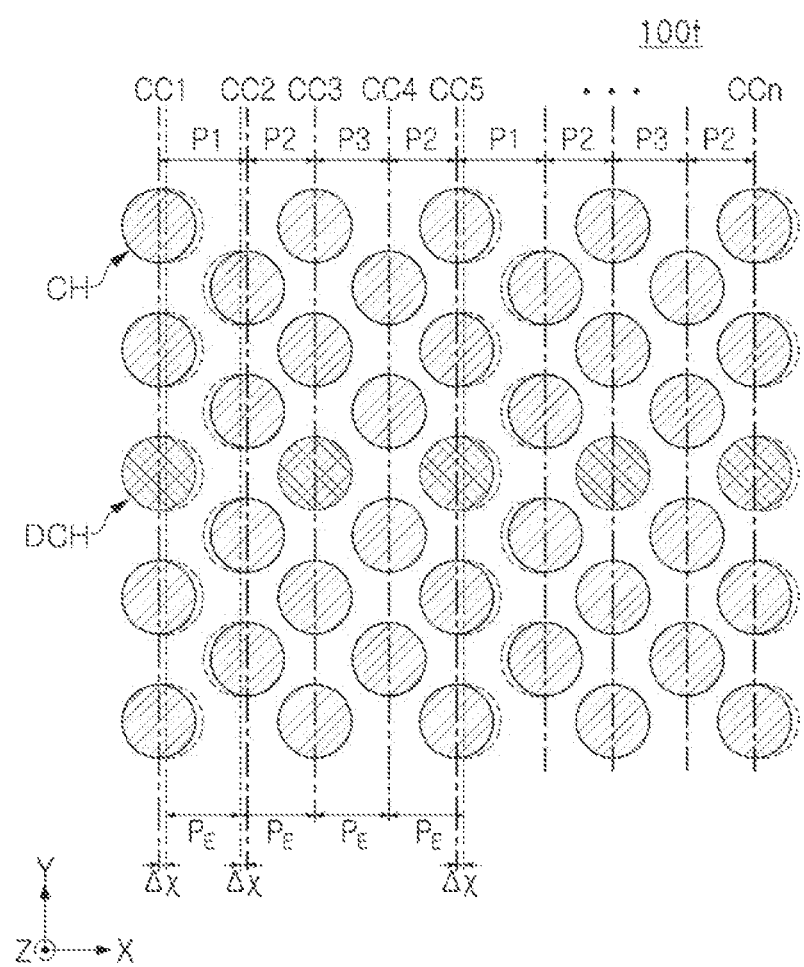
FIGS. 7A and 7B are plan views illustrating a semiconductor device according to an example embodiment of the present invention.
Figure 7B:
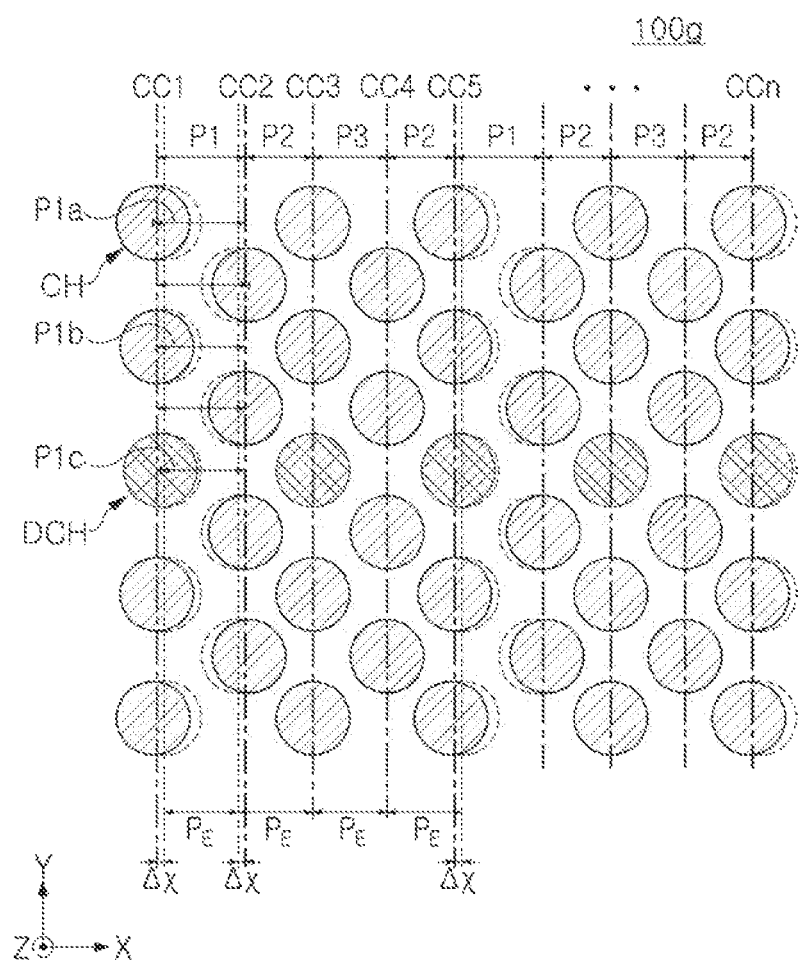

FIGS. 7A and 7B are plan views illustrating a semiconductor device according to an example embodiment, illustrating regions corresponding to FIG. 1B.

Referring to FIG. 7A, in a semiconductor device 100f, the channel columns CC1-CCn may be arranged repeatedly with the first to third pitches P1, P2, and P3 in the pattern of ABCB in the order of P1/P2/P3/P2 in the x direction. Hereinafter, the first and second pitches P1 and P2 may not necessarily refer to pitches of the same size as those of the first and second pitches P1 and P2 in the example embodiment described with reference to FIGS. 1A to 6B, and may be defined independently in the example embodiments.

In the channel columns CC1-CCn, the first channel column CC1 may be shifted to the left by a predetermined length Δx from the equally spaced pitch $P_E$ arranged with an equal distance, and the second channel column CC2 may be shifted to the right by a predetermined length (Δx), for example. The third and fourth channel columns CC3 and CC4 may be fixed (e.g., not offset), and this pattern may be repeated by a unit of four columns. Accordingly, the first pitch P1 may be greater than the equally spaced pitch $P_E$, the second pitch P2 may be smaller than the equally spaced pitch $P_E$, and the third pitch P3 may be equal to the equally spaced pitch $P_E$. However, in example embodiments, the relative sizes of the first to third pitches P1, P2, and P3 may be varied. The sum (P1+P2+P3+P2) of the pitches of a single period pattern up to the first to fifth channel columns CC1 to CC5 may be four times the equally spaced pitch $P_E$, and when the bit line pitch BLP (see FIG. 1A) is constant, the sum may be 8 times the bit line pitch BLP.

Referring to FIG. 7B, in a semiconductor device 100g, as for the channel structures CH, the degree in which the channel structures CH in each row along the x direction are shifted may be different in at least one of the shifted channel columns among the channel columns CC1-CCn, differently from the example embodiment in FIG. 7A.

For example, in the first channel column CC1, the channel structures CH in the rows most adjacent to (e.g., in the rows closest to) the separation region MS (see FIG. 1A) may have a first modified pitch P1a between the adjacent second channel column CC2, the channel structures CH in the inner rows among the rows may have a second modified pitch P1b smaller than the first modified pitch P1a, and the channel structures CH in the central rows may have a third modified pitch P1c smaller than the second modified pitch P1b. The channel structures CH may be symmetrically disposed in the y direction with respect to the dummy channel structures DCH. One of the first to third modified pitches P1a, P1b, and P1c may be the same as the first pitch PT, but an example embodiment thereof is not limited thereto. In some example embodiments, the channel structures CH in another shifted channel column among the channel columns CC1-CCn, such as, for example, the channel structures CH in the second channel column CC2, and/or the channel structures CH in the non-shifted channel columns may have different modified pitches depending on the row.

Figure 8A:
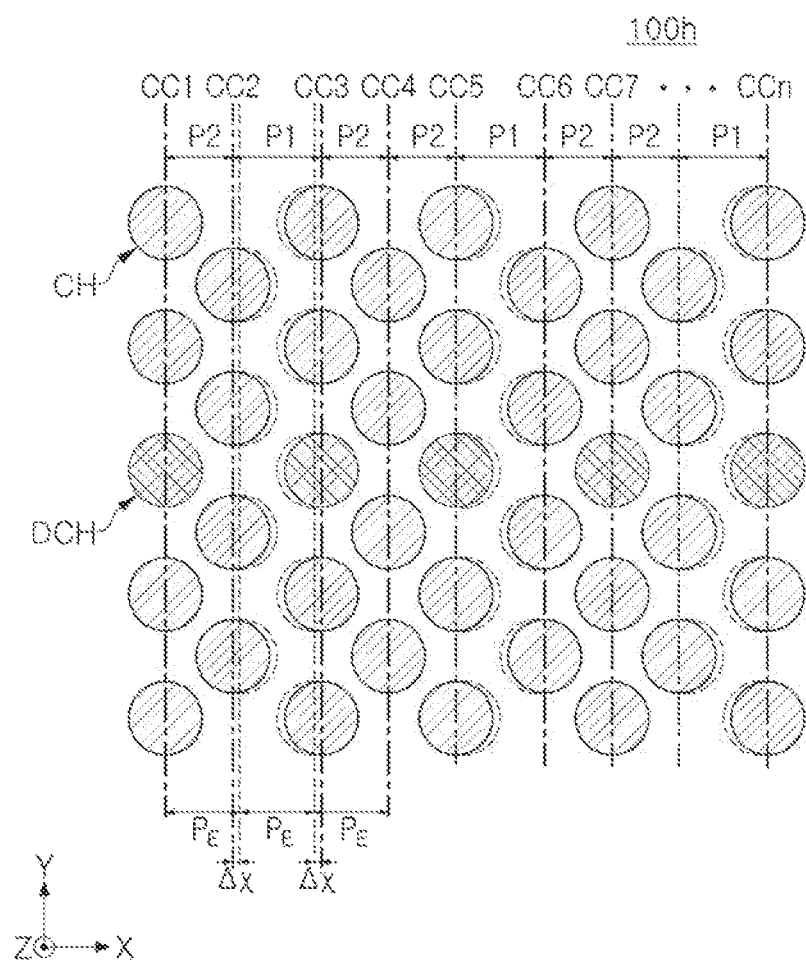
FIGS. 8A and 8B are plan views illustrating a semiconductor device according to an example embodiment of the present invention.
Figure 8B:
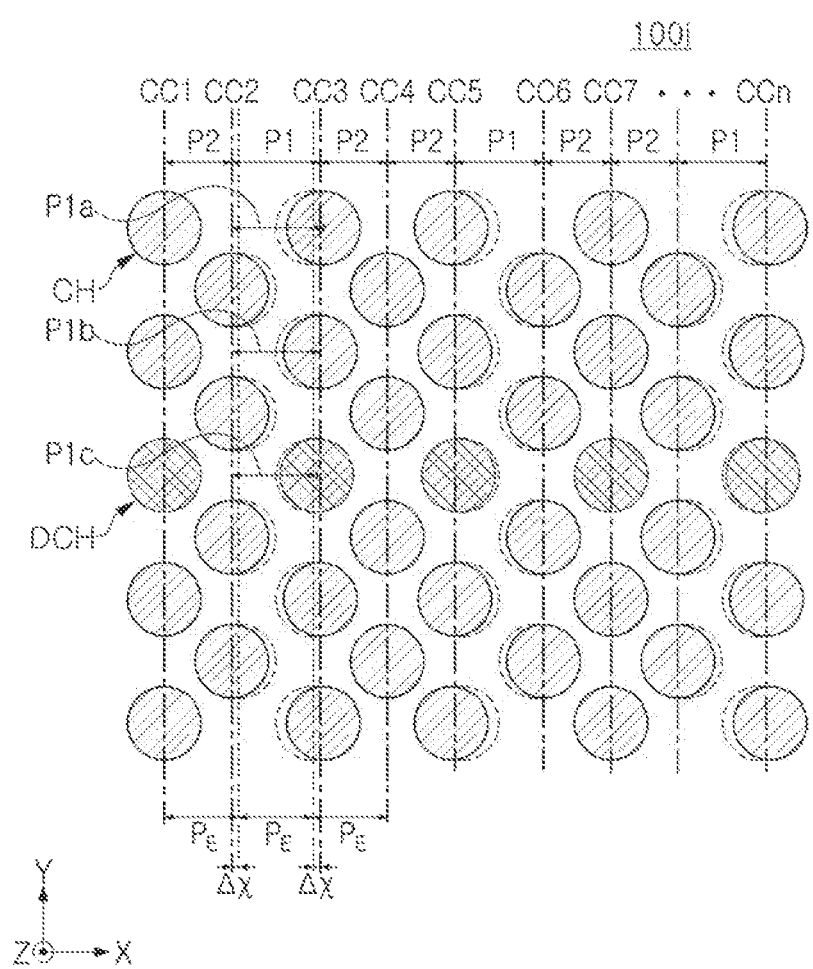

FIGS. 8A and 8B are plan views illustrating a semiconductor device according to an example embodiment, illustrating regions corresponding to FIG. 1B.

Referring to FIG. 8A, in a semiconductor device 100h, the channel columns CC1-CCn may be arranged repeatedly with the first and second pitches P1 and P2 in the pattern of BABBAB in the order of P2/P1/P2/P2/P1/P2 in the x direction.

In the channel columns CC1-CCn, the second channel column CC2 may be shifted to the left by a predetermined length Δx from the equally spaced pitch $P_E$ arranged with an equal distance, and the third channel column CC3 may be shifted to the right by a predetermined length Δx, for example. The first and fourth channel columns CC1 and CC4 may be fixed (e.g., not offset), and this pattern may form a mirror shape with respect to the fourth channel column CC4. Accordingly, the first pitch P1 may be greater than the equally spaced pitch $P_E$, and the second pitch P2 may be smaller than the equally spaced pitch $P_E$. However, in example embodiments, the relative sizes of the first and second pitches P1 and P2 may be varied. The sum (P2+P1+P2+P2+P1+P2) of the pitches of a single period pattern up to the first to seventh channel columns CC1-CC7 may correspond to 6 times the equally spaced pitch $P_E$, and when the bit line pitch BLP (see FIG. TA) is constant, the sum may correspond to 12 times the bit line pitch BLP.

Referring to FIG. 8B, in a semiconductor device 100i, as for the channel structures CH, the degree in which the channel structures CH in each row in the x direction are shifted may be different in at least one of the shifted channel columns among the channel columns CC1-CCn, differently from the example embodiment in FIG. 8A.

For example, in the third channel column CC3, the channel structures CH in the rows most adjacent to (e.g., in the rows closest to) the separation region MS (see FIG. 1A) may have a first modified pitch P1a with the adjacent second channel column CC2, the channel structures CH in the inner rows from the rows may have a second modified pitch P1b smaller than the first modified pitch P1a, and the channel structures CH in the central rows may have a third modified pitch P1c smaller than the second modified pitch P1b. The channel structures CH may be symmetrically disposed in the y direction with respect to the dummy channel structures DCH. One of the first to third modified pitches P1a, P1b, and P1c may be the same as the first pitch P1, but an example embodiment thereof is not limited thereto.

In some example embodiments, the channel structures CH in the other shifted channel columns among the channel columns CC1-CCn, such as, for example, the second channel column CC2, and/or the channel structures CH in non-shifted channel columns may have different modified pitches depending on the row.

Figure 9A:
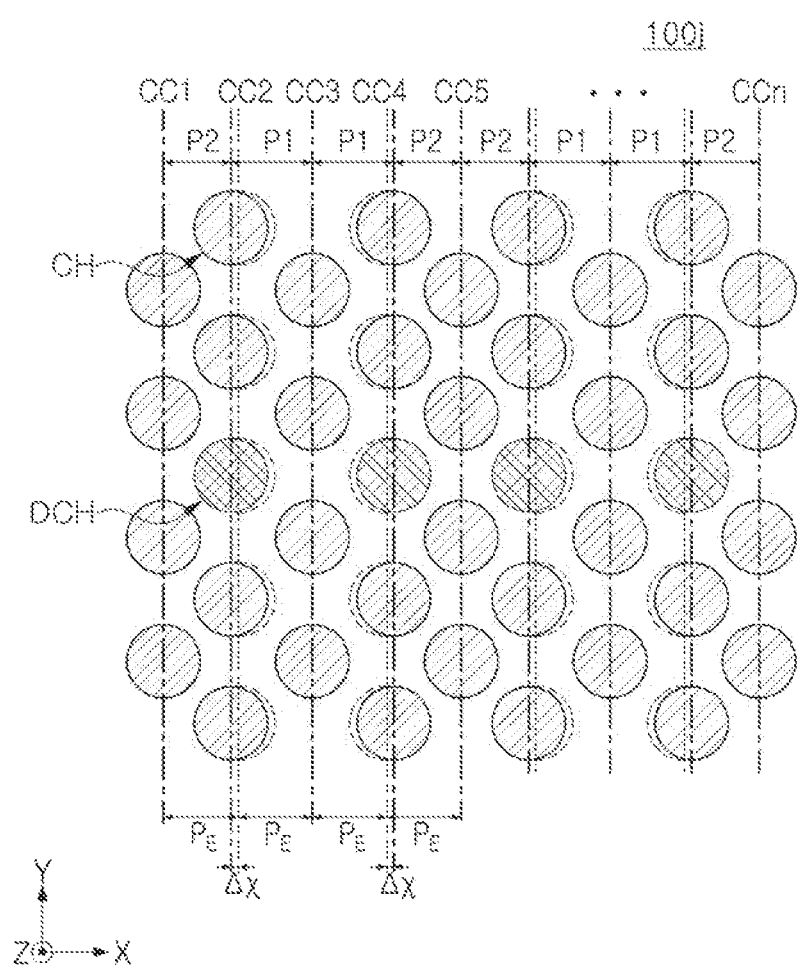
FIGS. 9A to 9C are plan views illustrating a semiconductor device according to an example embodiment of the present invention.
Figure 9B:
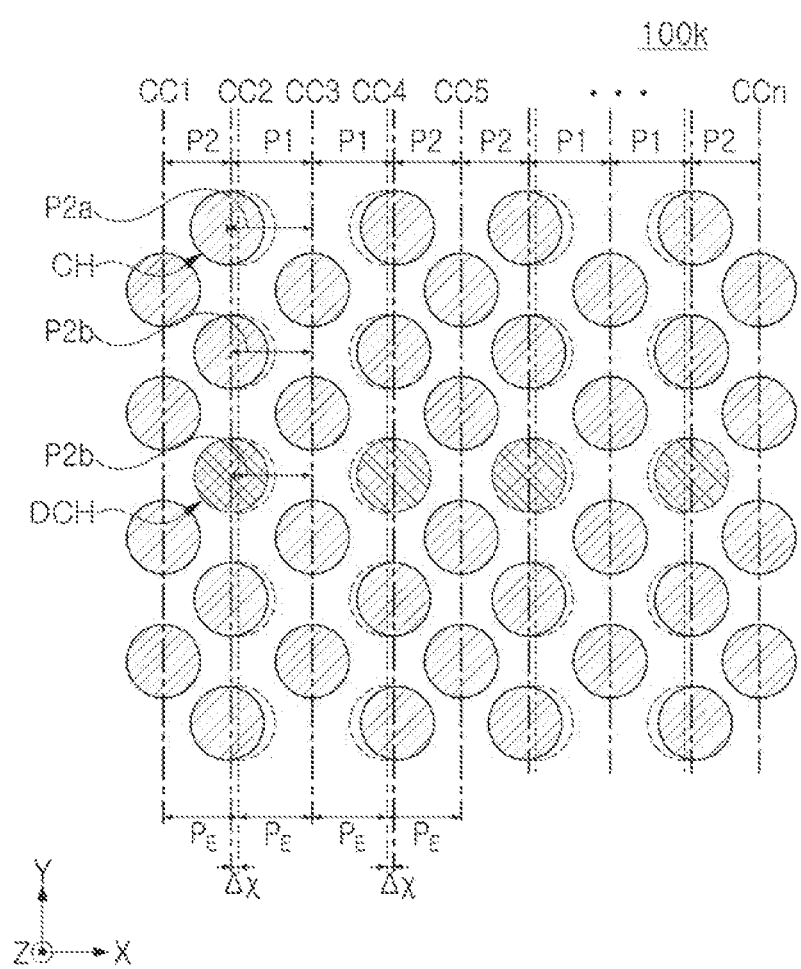
Figure 9C:
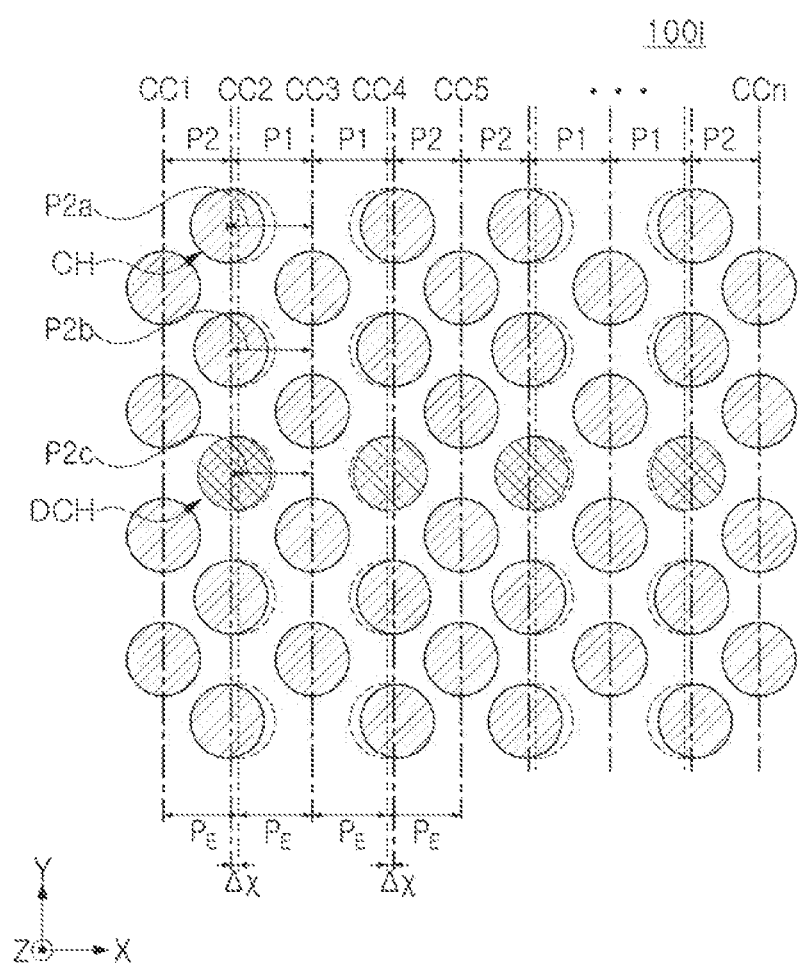

FIGS. 9A to 9C are plan views illustrating a semiconductor device according to an example embodiment, illustrating regions corresponding to FIG. 1B.

Referring to FIG. 9A, in a semiconductor device 100j, the channel columns CC1-CCn may be repeatedly arranged with the first and second pitches P1 and P2 in the pattern of BARB in the order of P2/P1/P1/P2 in the x direction.

In the channel columns CC1-CCn, the second channel column CC2 may be shifted to the left by a predetermined length Δx from the equally spaced pitch $P_E$ arranged with an equal distance, and the fourth channel column CC4 may be shifted to the right by a predetermined length Δx, for example. The first, third, and fifth channel columns CC1, CC3, and CC5 may be fixed (e.g., not offset), and the first to fifth channel columns CC1-CC5 may be arranged symmetrically with reference to the third column CC3. Accordingly, the first pitch P1 may be greater than the equally spaced pitch $P_E$, and the second pitch P2 may be smaller than the equally spaced pitch $P_E$. The sum (P2+P1+P1+P2) of the pitches of a single period pattern up to the first to fifth channel columns CC1-CC5 may correspond to 4 times the equally spaced pitch $P_E$, and when the hit line pitch BLP (see FIG. 1A) is constant, the sum may correspond to 8 times the hit line pitch BLP.

Referring to FIGS. 9B and 9C, in a semiconductor devices 100k and 100l, in at least one of the shifted channel columns among the channel columns CC1-CCn, the degree in which the channel structures CH in each row taken in the x direction are shifted may be varied, differently from the example embodiment in FIG. 9A.

As illustrated in FIG. 9B, for example, in the second channel column CC2, the channel structures CH in the outer rows most adjacent to (e.g., in the rows closest to) the separation region MS (see FIG. 1A) may have a first modified pitch P2a with the adjacent third channel column CC3, and the channel structures CH in the inner rows from the rows may have a second modified pitch P2b smaller than the first modified pitch P2a. The channel structures CH may be symmetrically disposed in the y direction with respect to the dummy channel structures DCH. In example embodiments, the second modified pitch P2b may be the same as or different from the second pitch P2.

As illustrated in FIG. 9C, for example, in the second channel column CC2, the channel structures CH in the rows most adjacent to (e.g., in the rows closest to) the separation region MS (see FIG. 1A) have a first modified pitch P2a with the adjacent third channel column CO, and the channel structures CH in the inner rows among the rows may have a second modified pitch P2b smaller than the first modified pitch P2a. The channel structures CH in the central row among the rows may have a third modified pitch P2c smaller than the second modified pitch P2b. The channel structures CH may be symmetrically disposed in the y direction with respect to the dummy channel structures DCH. For example, in the second channel column CC2, the channel structures CH in outer rows most adjacent to (e.g., in the rows closest to) the separation region MS may be further shifted by a first length toward the first channel column CC1, and the channel structures CH in the inner rows may be further shifted by a second length smaller than the first length or may not be further shifted. The channel structure CH in the central row may be further shifted by a third length smaller than the first length and the second length, may not be further shifted, or may be shifted in an opposite direction, the right direction. One of the first to third modified pitches P2a, P2b, and P2c may be the same as the second pitch P2, but an example embodiment thereof is not limited thereto. In some embodiments, channel structures CH of outer rows that are closest to the separation regions MS (see FIG. 1A) may be shifted from a center line between the first channel column CC1 and the third channel column CC3 in the x direction by a first distance (e.g., P2a-$P_E$) toward the first channel column CC1, and channel structures CH of inner rows that are between the outer rows may be shifted from the center line between the first channel column CC1 and the third channel column CC3 in the x direction by a second distance (e.g., P2b-$P_E$ or P2c-$P_E$) toward the first channel column CC1 as illustrated in FIG. 9C.

In example embodiments, the channel strictures CH in other shifted channel columns among the channel columns CC1-CCn, such as, for example, the fourth channel column CC4, and/or non-shifted channel columns may have different modified pitches depending on the row.

Figure 10A:
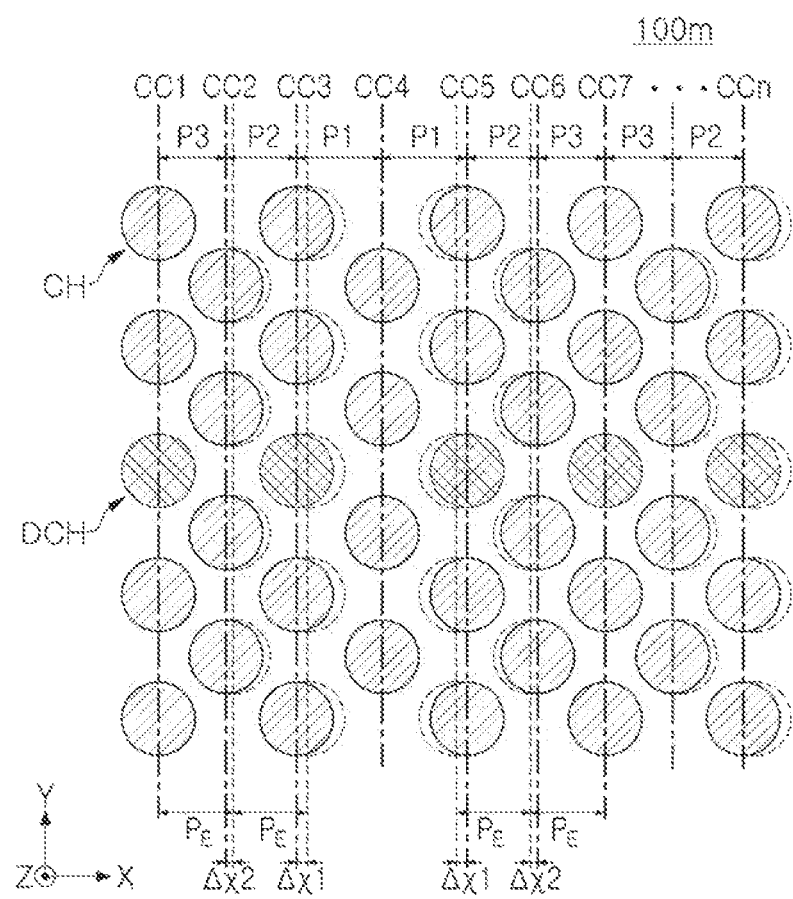
FIGS. 10A to 10C are plan views illustrating a semiconductor device according to an example embodiment of the present invention.
Figure 10B:
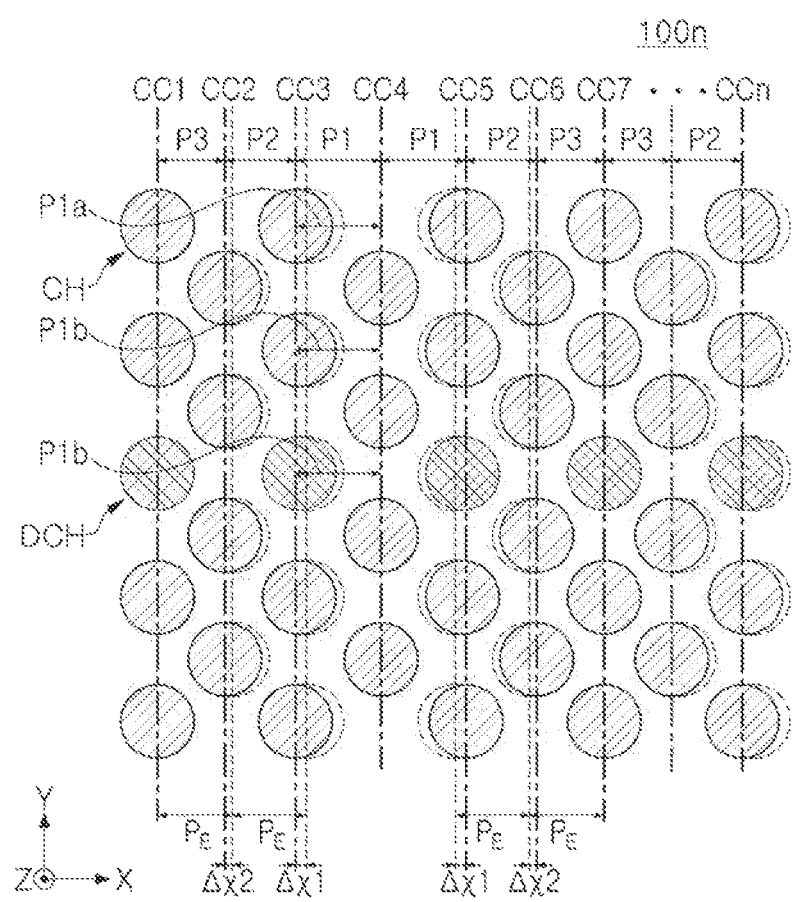
Figure 10C:
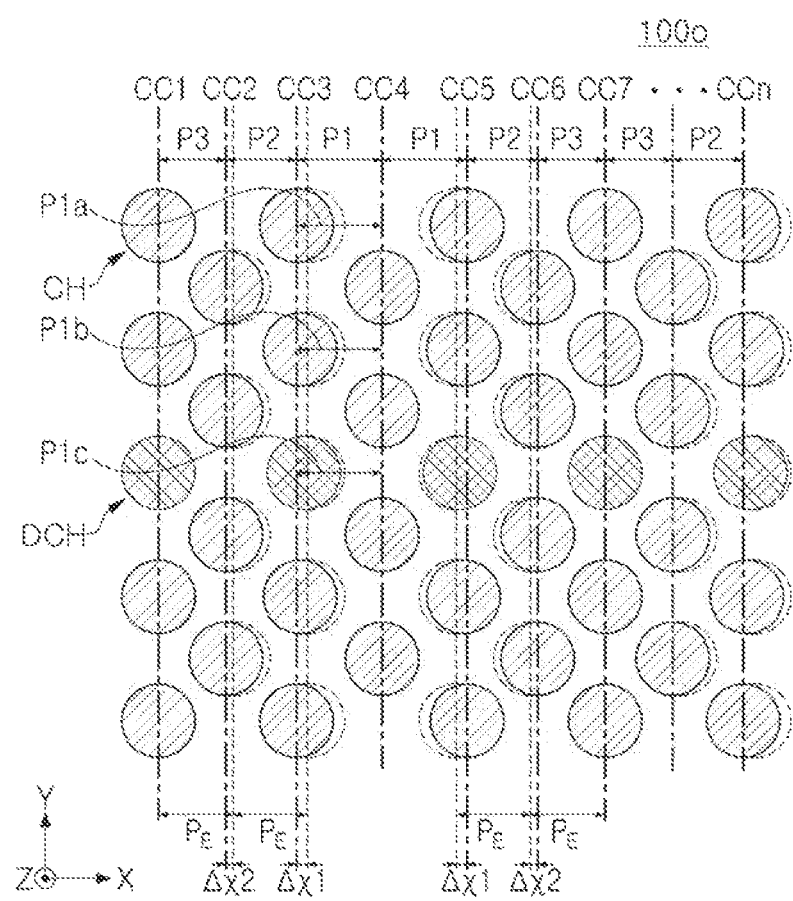

FIGS. 10A to 10C are plan views illustrating a semiconductor device according to an example embodiment, illustrating regions corresponding to FIG. 1B.

Referring to FIG. 10A, in a semiconductor device 100m, the channel columns CC1-CCn, may be arranged repeatedly with the first to third pitches P1, P2, and P3 in a pattern of CBAABC in the order of P3/P2/P1/P1/P2/P3 in the x direction.

In the channel columns CC1-CCn, the third channel column CC3 may be shifted to the left by a first length Δx1 from the equally spaced pitch $P_E$, arranged with an equal distance, and the second channel column CC2 may be shifted to the left by a second length $\Delta x2$, for example. Symmetrically with respect to the fourth channel column CC4, the fifth channel column CC5 may be shifted to the right by a first length $\Delta x1$ and the sixth channel column CC6 may be shifted to the right by a second length $\Delta x2$. The first length $\Delta x1$ and the second length $\Delta x2$ may be the same as or different from each other. The first, fourth, and seventh channel columns CC1, CC4, and CC7 may be fixed (e.g., not offset).

Accordingly, the first pitch P1 may be greater than the equally spaced pitch $P_E$, the second pitch P2 may be the same as or different from the equally spaced pitch $P_E$, and the third pitch P3 may be smaller than the equally spaced pitch $P_E$. The sum (P3+P2+P1+P1+P2+P3) of the pitches of a single period pattern up to the first to seventh channel columns CC1-CC7 may correspond to 6 times the equally spaced pitch $P_E$, and When the bit line pitch BLP (see FIG. 1A) is constant, the sum may correspond to 12 times the bit line pitch BLP.

Referring to FIGS. 10B and 10C, in semiconductor devices 100n and 100o, in at least one of the shifted channel columns among the channel columns CC1-CCn, the degree the channel structures CH in each row taken in the x direction are shifted may be varied, differently from the example embodiment in FIG. 10A.

As illustrated in FIG. 10B, in the third channel column CC3, for example, the channel structures CH in the outer rows most adjacent to (e.g., in the rows closest to) the separation region MS (see FIG. 1A) may have a first modified pitch P1a with the adjacent four channel columns CC4, and the channel structures CH in the inner rows from the rows may have a second modified pitch P1b smaller than the first modified pitch P1a. The channel structures CH may be symmetrically disposed in the y direction with respect to the dummy channel structures DCH. In example embodiments, the second change pitch P1b may be the same as or different from the first pitch P1.

As illustrated in FIG. 10C, in the second channel column CC2, the channel structures CH in the rows most adjacent to (e.g., in the rows closest to) the separation region MS (see FIG. 1A) may have a first modified pitch P1a with the adjacent third channel column CC3, the channel structures CH in the inner rows from the rows may have a second modified pitch P1b smaller than the first modified pitch P1a, and the channel structures CH in the central rows may have a third modified pitch P1c smaller than the second modified pitch P1b. The channel structures CH may be symmetrically disposed in the y direction with respect to the dummy channel structures DCH. One of the first to third modified pitches P1a, P1b, and P1c may be the same as the second pitch P2, but an example embodiment thereof is not limited thereto.

In example embodiments, the channel structures CH in another shifted channel column among the channel columns CC1-CCn, such as, for example, the channel structures CH in the third channel column CC3 and/or the channel structures CH in the non-shifted channel columns may have different modified pitches depending on the row.

Figure 11:
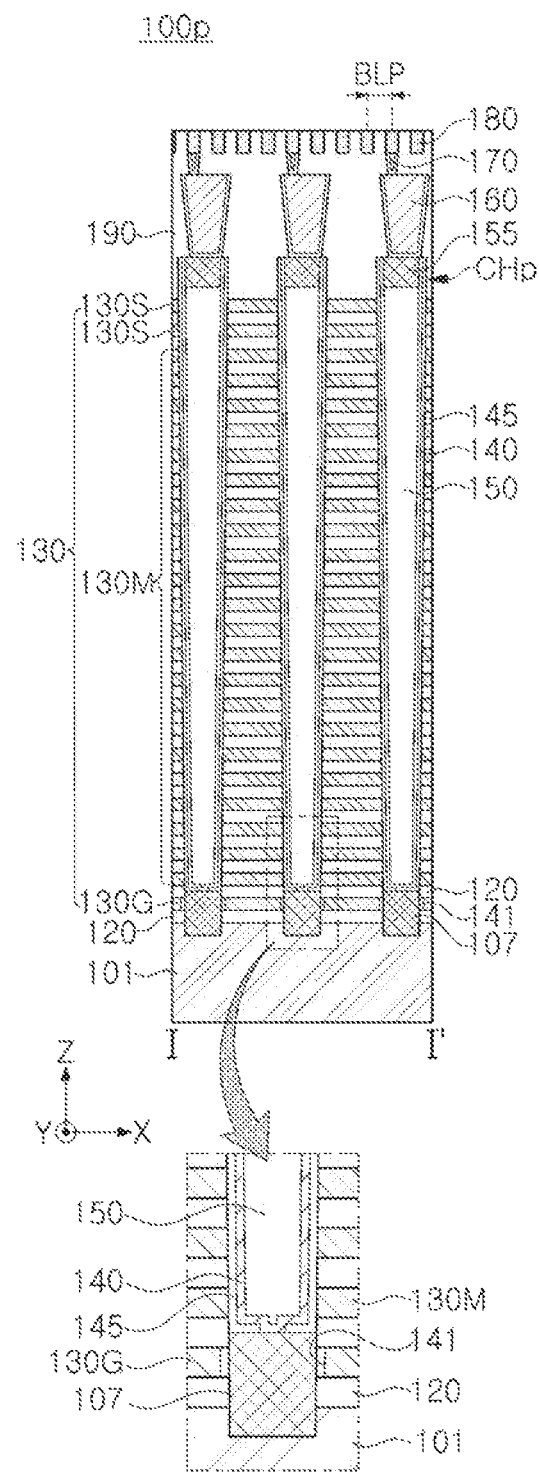
FIG. 11 is a cross-sectional view illustrating a semiconductor device according to an example embodiment of the present invention.

FIG. 11 is a cross-sectional view illustrating a semiconductor device according to an example embodiment, which corresponds to the cross-sectional view taken along line I-I' in FIG. 1A.

Referring to FIG. 11, in the semiconductor device loop, the memory cell structure CELL may not include first and second horizontal conductive layers 102 and 104 on the substrate 101, differently from the example embodiment in FIGS. 2A and 2B. Also, the channel structure CHp may further include an epitaxial layer 107.

The epitaxial layer 107 may be disposed on the substrate 101 on the lower end of the channel structure CHp, and may be disposed on a side surface of the at least one gate electrode 130. The epitaxial layer 107 may be disposed in the recessed region of the substrate 101. The height of the lower surface of the epitaxial layer 107 may be higher than the upper surface of the lowermost lower gate electrode 130G and lower than the lower surface of the memory gate electrode 130M disposed above the lowermost lower gate electrode 130G, but an example embodiment thereof is not limited thereto. The epitaxial layer 107 may be connected to the channel layer 140 through the upper surface. A gate insulating layer 141 may be further disposed between the epitaxial layer 107 and the lower gate electrode 130G in contact with the epitaxial layer 107. The above-described shape of the channel structure Clip may be applied to other example embodiments.

Figure 12:
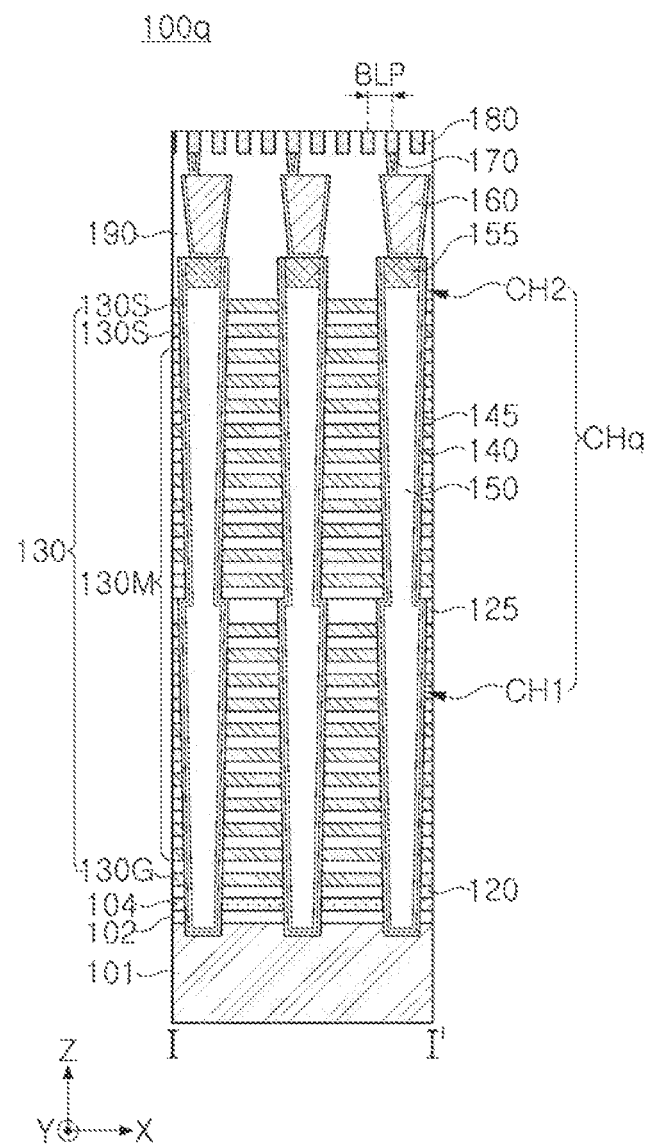
FIG. 12 is a cross-sectional view illustrating a semiconductor device according to an example embodiment of the present invention.

FIG. 12 is a cross-sectional view illustrating a semiconductor device according to an example embodiment, which corresponds to the cross-sectional view taken along line in FIG. 1A.

Referring to FIG. 12, in a semiconductor device 100q, a stack structure of the gate electrodes 130 may include vertically stacked lower and upper stack structures, and the channel structures CHq may include first and second channel structures CH1 and CH2 vertically stacked. The structure of the channel structures CHq may be introduced to stably form the channel structures CHq when the number of the gate electrodes 130 stacked is relatively large. In example embodiments, the number of stacked channel structures may be varied.

The channel structures CHq may include the lower first channel structures CH1 and the upper second channel structures CH2 connected to each other, and may have a bent portion due to a difference in width in the connection region. may The channel layer 140, the gate dielectric layer 145, and the channel filling insulating layer 150 may be connected to each other between the first channel structure CH1 and the second channel structure CH2. The channel pad 155 may be disposed only on the upper end of the upper second channel structure CH2. However, in example embodiments, each of the first channel structure CH1 and the second channel structure CH2 may include a channel pad 155, and in this case, the channel pad 155 of the first channel structure CH1 may be connected to the channel layer 140 of the second channel structure CH2. An upper interlayer insulating layer 125 having a relatively greater thickness may be disposed on an uppermost portion of the lower stack structure. However, the shapes of the interlayer insulating layers 120 and the upper interlayer insulating layer 125 may be varied in the example embodiments. As such, the form of the plurality of stacked channel structures CHq may be applied to other example embodiments.

Figure 13:
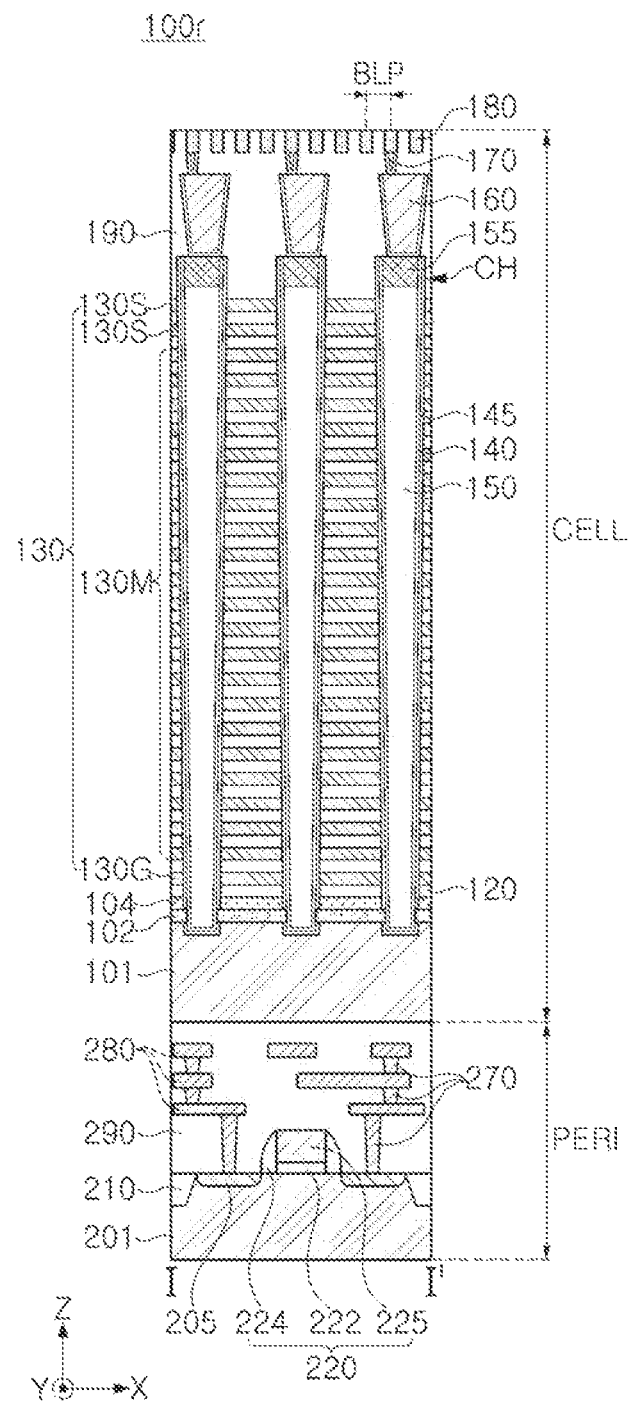
FIG. 13 is a cross-sectional view illustrating a semiconductor device according to an example embodiment of the present invention.

FIG. 13 is a cross-sectional view illustrating a semiconductor device according to an example embodiment, which corresponds to the cross-sectional view taken along line I-I' in FIG. 1A.

Referring to FIG. 13, a semiconductor device 100r may include a memory cell region CELL and a peripheral circuit region PERI stacked vertically. The memory cell region CELL may be disposed on the upper end of the peripheral circuit region PERI. For example, in the semiconductor device 100 in FIGS. 2A and 2B, the peripheral circuit region PERI may be disposed on the substrate 101 in a region not illustrated, or a peripheral circuit region PERI may be disposed therebelow as in the semiconductor device 100r in the example embodiment. In example embodiments, the cell region CELL may be disposed below the peripheral circuit region PERI. The description described with reference to FIGS. 1A to 2B may be applied to the description of the memory cell region CELL.

The peripheral circuit region PERI may include a base substrate 201, circuit devices 220 disposed on the base substrate 201, circuit contact plugs 270, and circuit interconnection lines 280.

The base substrate 201 may have an upper surface extending in the x direction and the y direction. Device isolation layers 210 may be formed on the base substrate 201 such that an active region may be defined. Source/drain regions 205 including impurities may be disposed in a portion of the active region. The base substrate 201 may include a semiconductor material, such as, for example, a group IV semiconductor, a group III-V compound semiconductor, or a group II-VI compound semiconductor. The base substrate 201 may be provided as a bulk wafer or an epitaxial layer. In the example embodiment, the upper substrate 101 may be provided as a polycrystalline semiconductor layer such as a polycrystalline silicon layer or an epitaxial layer.

The circuit devices 220 may include a horizontal transistor. Each of the circuit devices 220 may include a circuit gate dielectric layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate (e.g., extend through) the peripheral region insulating layer 290 and may be connected to the source/drain regions 205. An electrical signal may be applied to the circuit device 220 by the circuit contact plugs 270. In a region not illustrated, the circuit contact plugs 270 may also be connected to the circuit gate electrode 225. The circuit interconnection lines 280 may be connected to the circuit contact plugs 270 and may be arranged in a plurality of layers.

In the semiconductor device 100r, the peripheral circuit region PERI may be manufactured, and the substrate 101 of the memory cell region CELL may be formed thereon, such that the memory cell region CELL may be manufactured. The substrate 101 may have the same size as that of the base substrate 201 or may be formed to have a size smaller than that of the base substrate 201. The memory cell region CELL and the peripheral circuit region PERI may be connected to each other in a region not illustrated. For example, one end of the gate electrode 130 in the y direction may be electrically connected to the circuit devices 220. As described above, the form in which the memory cell region CELL and the peripheral circuit region PERI are vertically stacked may be applied to other example embodiments.

Figure 14:
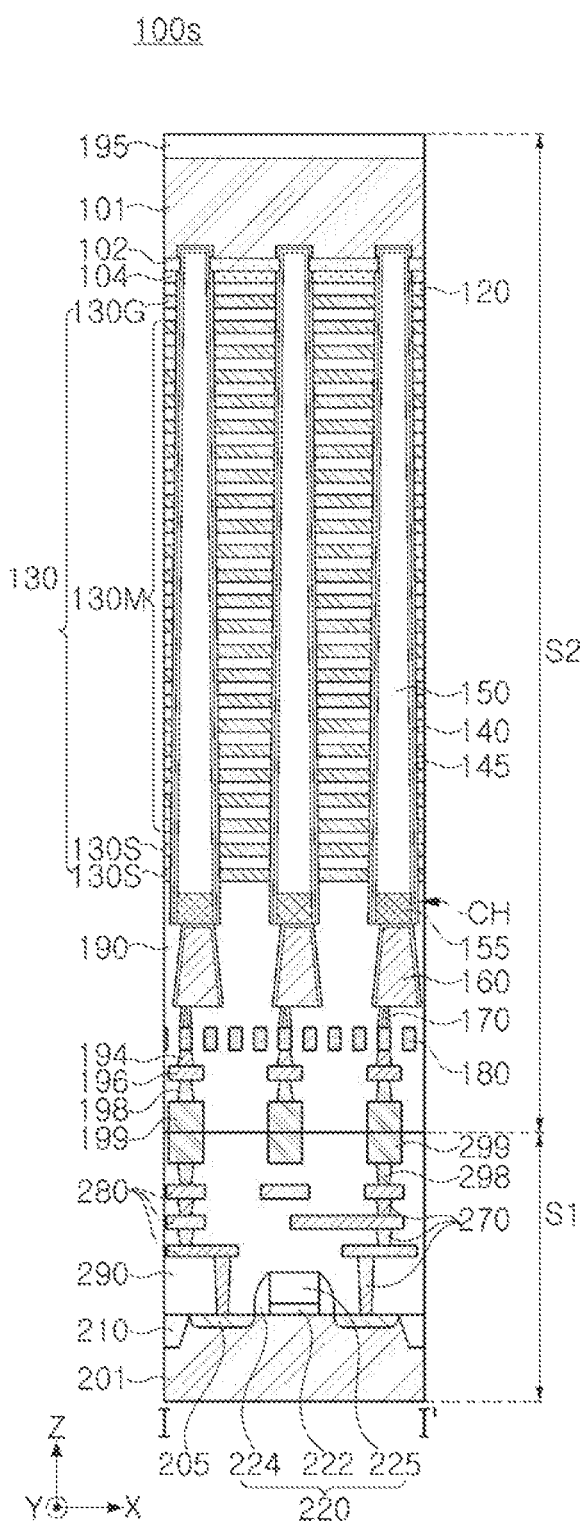
FIG. 14 is a cross-sectional view illustrating a semiconductor device according to an example embodiment of the present invention.

FIG. 14 is a cross-sectional view illustrating a semiconductor device according to an example embodiment.

Referring to FIG. 14, a semiconductor device 100s may include a first semiconductor structure S1 and a second semiconductor structure S2 bonded by a wafer bonding method.

The description of the peripheral circuit region PERI described above with reference to FIG. 13 may be applied to the first semiconductor structure S1. However, the first semiconductor structure S1 may further include first bonding vias 298 and first bonding pads 299, which may be bonding structures. The first bonding vias 298 may be disposed on the uppermost circuit interconnection lines 280 and may be connected to the circuit interconnection lines 280. At least a portion of the first bonding pads 299 may be connected to the first bonding vias 298 on the first bonding vias 298. The first bonding pads 299 may be connected to the second bonding pads 199 of the second semiconductor structure S2. The first bonding pads 299 may provide an electrical connection path according to the bonding between the first semiconductor structure S1 and the second semiconductor structure S2 together with the second bonding pads 199. The first bonding vias 298 and the first bonding pads 299 may include a conductive material, such as, for example, copper (Cu).

The descriptions described with reference to FIGS. 1A to 3 may be applied to the second semiconductor structure S2, unless otherwise indicated. The second semiconductor structure S2 may further include cell contact plugs 194 and cell interconnection lines 196, which may be interconnection structures, and may further include second bonding vias 198 and second bonding pads 199, which may be a bonding structure. The second semiconductor structure S2 may further include a protective layer 195 covering the upper surface of the substrate 101.

The cell contact plugs 194 may penetrate (e.g., extend through) the cell region insulating layer 190 and may be connected to the bit lines 180. The cell interconnection lines 196 may be disposed below the cell contact plugs 194, and may connect the cell contact plugs 194 to the second bonding vias 198. However, in example embodiments, the number of layers and the arrangement of the cell contact plugs and the cell interconnection lines forming the interconnection structure may be varied. The cell contact plugs 194 and the cell interconnection lines 196 may be formed of a conductive material, and may include, for example, at least one of tungsten (W), aluminum (Al), and copper (Cu).

The second bonding vias 198 and the second bonding pads 199 may be disposed below the lowermost cell interconnection lines 196. The second bonding vias 198 may be connected to the cell interconnection lines 196 and the second bonding pads 199, and the second bonding pads 199 may be bonded to the first bonding pads 299 of the first semiconductor structure S1. The second bonding vias 198 and the second bonding pads 199 may include a conductive material, such as, for example, copper (Cu).

The first semiconductor structure S1 and the second semiconductor structure 52 may be bonded to each other by copper (Cu)-to-copper (Cu) bonding by the first bonding pads 299 and the second bonding pads 199, Other than the copper (Cu)-to-copper (Cu) bonding, the first semiconductor structure S1 and the second semiconductor structure S2 may also be bonded by dielectric-to-dielectric bonding. The dielectric-to-dielectric bonding may be bonding by dielectric layers forming each of the peripheral region insulating layer 290 and the cell region insulating layer 190 and surrounding each of the first bonding pads 299 and the second bonding pads 199. Accordingly, the first semiconductor structure S1 and the second semiconductor structure S2 may be bonded to each other without an adhesive layer.

FIGS. 15A to 15E are cross-sectional views illustrating methods of forming a semiconductor device according to an example embodiment, the cross-sectional views illustrating regions corresponding to FIG. 2B.

Figure 15A:
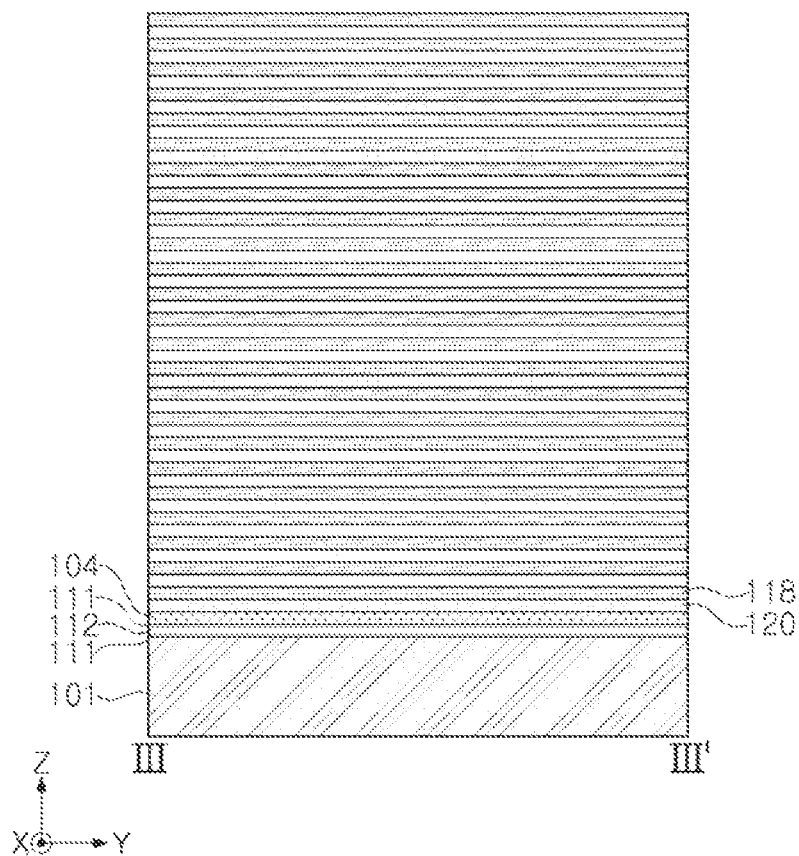
FIGS. 15A to 15E are cross-sectional views illustrating methods of forming a semiconductor device according to an example embodiment of the present invention.

Referring to FIG. 15A, first and second horizontal sacrificial layers 111 and 112 and a second horizontal conductive layer 104 may be formed on a substrate 101, and sacrificial insulating layers 118 and interlayer insulating layers 120 may be alternately stacked.

The first and second horizontal sacrificial layers 111 and 112 may be stacked on the substrate 101 such that the first horizontal sacrificial layers 111 may be disposed above and below the second horizontal sacrificial layer 112. The first and second horizontal sacrificial layers 111 and 112 may include different materials. The first and second horizontal sacrificial layers 111 and 112 may be replaced with the first horizontal conductive layer 102 (see FIG. 2B) through a subsequent process. For example, the first horizontal sacrificial layer 111 may be formed of the same material as that of the interlayer insulating layers 120, and the second horizontal sacrificial layer 112 may be formed of the same material as that of the sacrificial insulating layers 118. The second horizontal conductive layer 104 may be formed on the first and second horizontal sacrificial layers 111 and 112.

A portion of the sacrificial insulating layers 118 may be replaced with the gate electrodes 130 (see FIG. 2B) through a subsequent process. The sacrificial insulating layers 118 may be formed of a material different from that of the interlayer insulating layers 120, and may be formed of a material etched with etch selectivity for the interlayer insulating layers 120 under specific etching conditions. For example, the interlayer insulating layer 120 may be formed of at least one of silicon oxide and silicon nitride, and the sacrificial insulating layers 118 may be formed of a material different from that of the interlayer insulating layer 120, selected from among silicon, silicon oxide, or silicon carbide, and silicon nitride. In example embodiments, the thicknesses of the interlayer insulating layers 120 may not be the same. The thicknesses of the interlayer insulating layers 120 and the sacrificial insulating layers 118 and the number of films forming the interlayer insulating layers 120 and the sacrificial insulating layers 118 may be varied from the illustrated example.

Figure 15B:
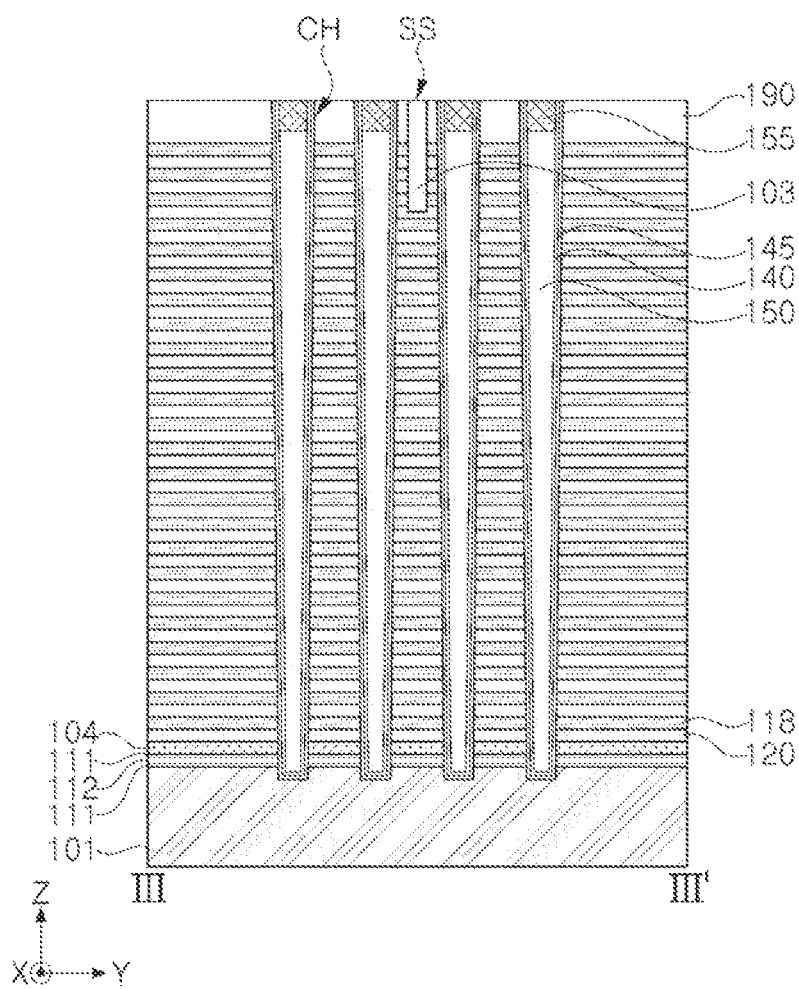

Referring to FIG. 15B, channel structures CH penetrating the stack structure of the sacrificial insulating layers 118 and the interlayer insulating layers 120 may be formed.

The cell region insulating layer 190 covering the stack structure of the sacrificial insulating layers 118 and the interlayer insulating layers 120 may be partially formed. Thereafter, the upper separation regions SS may be formed by partially removing the sacrificial insulating layers 118 and the interlayer insulating layers 120. The region in which the upper separation regions SS are formed may be exposed using a mask layer, and a predetermined number of the sacrificial insulating layers 118 and the interlayer insulating layers 120 may be removed from an uppermost portion, and an insulating material may be deposited, thereby forming the upper separation insulating layer 103.

Thereafter, as in the aforementioned example embodiment described with reference to FIGS. 1A to 2B, the channel structures CH may be formed to include regions in which the channel columns may have different pitches or spacing distances therebetween in the x direction. The channel structures CH may be formed by anisotropically etching the sacrificial insulating layers 118 and the interlayer insulating layers 120 using a mask layer, and may be formed by forming hole-shaped channel holes and filling the holes. Due to the height of the stack structure, sidewalls of the channel structures CH may not be perpendicular to the upper surface of the substrate 101. The channel structures CH may be formed to be recessed into a portion of the substrate 101. Thereafter, at least a portion of the gate dielectric layer 145, the channel layer 140, the channel filling insulating layer 150, and the channel pad 155 may be formed in order in the channel structures CH.

The gate dielectric layer 145 may be formed to have a uniform thickness using an ALD or CVD process. In this process, the entire gate dielectric layer 145 or a portion of the gate dielectric layer 145 may be formed, and a portion extending perpendicularly to the substrate 101 along the channel structures CH may be formed in this process. The channel layer 140 may be formed on the gate dielectric layer 145 in the channel structures CH. The channel filling insulating layer 150 may be formed to fill the channel structures CH, and may be an insulating material. The channel pad 155 may be formed of a conductive material, such as, for example, polycrystalline silicon.

Figure 15C:
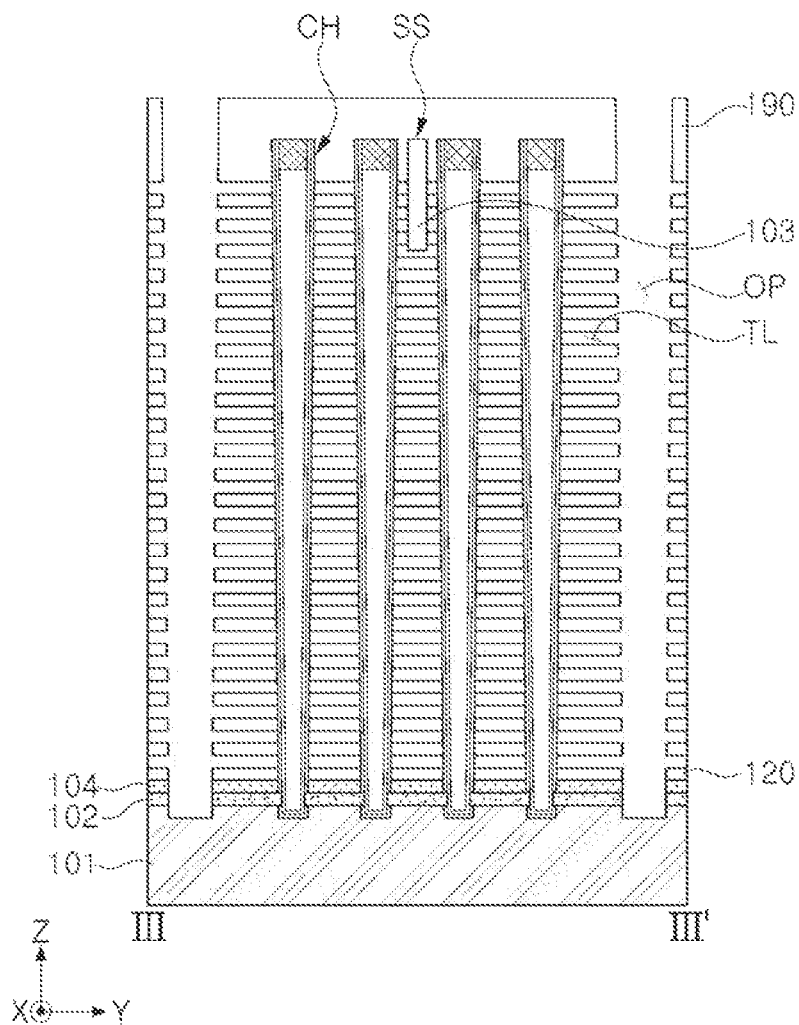

Referring to FIG. 15C, openings OP penetrating the stack structure of the sacrificial insulating layers 118 and the interlayer insulating layers 120 may be formed in regions corresponding to the separation regions MS (see FIG. 1), the first horizontal conductive layer 102 may be formed, the sacrificial insulating layers 118 may be removed, and the tunnel portions TL may be formed.

The cell region insulating layer 190 may be additionally formed on the channel structures CH and the openings OP may be formed. The openings OP may extend in the x direction by penetrating the stack structure of the sacrificial insulating layers 118 and the interlayer insulating layers 120, and penetrating the second horizontal conductive layer 104 in a lower portion. Thereafter, while forming sacrificial spacer layers in the openings OP, the second horizontal sacrificial layer 112 may be exposed by an etch-back process. The exposed second horizontal sacrificial layer 112 may be selectively removed, and the first horizontal sacrificial layers 111 disposed above and below the second horizontal sacrificial layer 112 may be removed.

The first and second horizontal sacrificial layers 111 and 112 may be removed by, for example, a wet etching process. In the process of removing the first and second horizontal sacrificial layers 111 and 112, a portion of the gate dielectric layer 145 exposed in the region from which the second horizontal sacrificial layer 112 is removed may also be removed. The first horizontal conductive layer 102 may be formed by depositing a conductive material in the region from which the first and second horizontal sacrificial layers 111 and 112 are removed, and the sacrificial spacer layers may be removed from the openings OP.

Thereafter, the sacrificial insulating layers 118 may be selectively removed through the openings OP. The sacrificial insulating layers 118 may be selectively removed with respect to the interlayer insulating layers 120 using, for example, wet etching. Accordingly, a plurality of tunnel portions TL may be formed between the interlayer insulating layers 120. In this process, the channel structures CH may be arranged with a plurality of different pitches in the x direction, such that a process of removing the sacrificial insulating layers 118 may be easily performed.

Figure 15D:
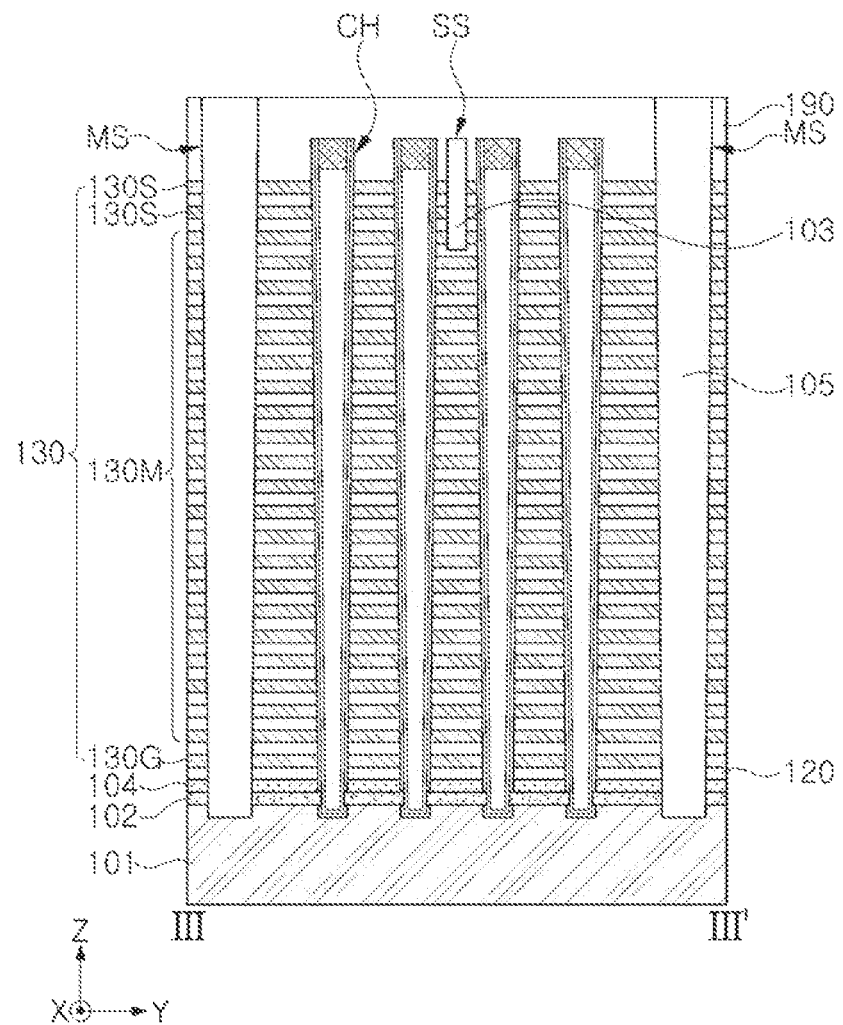

Referring to FIG. 15D, the gate electrodes 130 may be formed by filling the tunnel portions TL with a conductive material, and the separation insulating layers 105 may be formed.

The conductive material forming the gate electrodes 130 may fill the tunnel portions TL. The conductive material may include a metal, polycrystalline silicon, or a metal silicide material. In this process, the channel structures CH may be arranged with a plurality of different pitches in the x direction, such that the process of forming the gate electrodes 130 may be easily performed without defects.

After forming the gate electrodes 130, the conductive material deposited in the openings OP may be removed through an additional process, and the separation insulating layers 105 may be formed. When the conductive material is removed, the gate electrodes 130 may be partially removed from the openings OP. In this case, the separation insulating layers 105 may include regions partially horizontally extending from the openings OP to the side surfaces of the gate electrodes 130. By forming the separation insulating layers 105, separation regions MS may be formed.

Figure 15E:
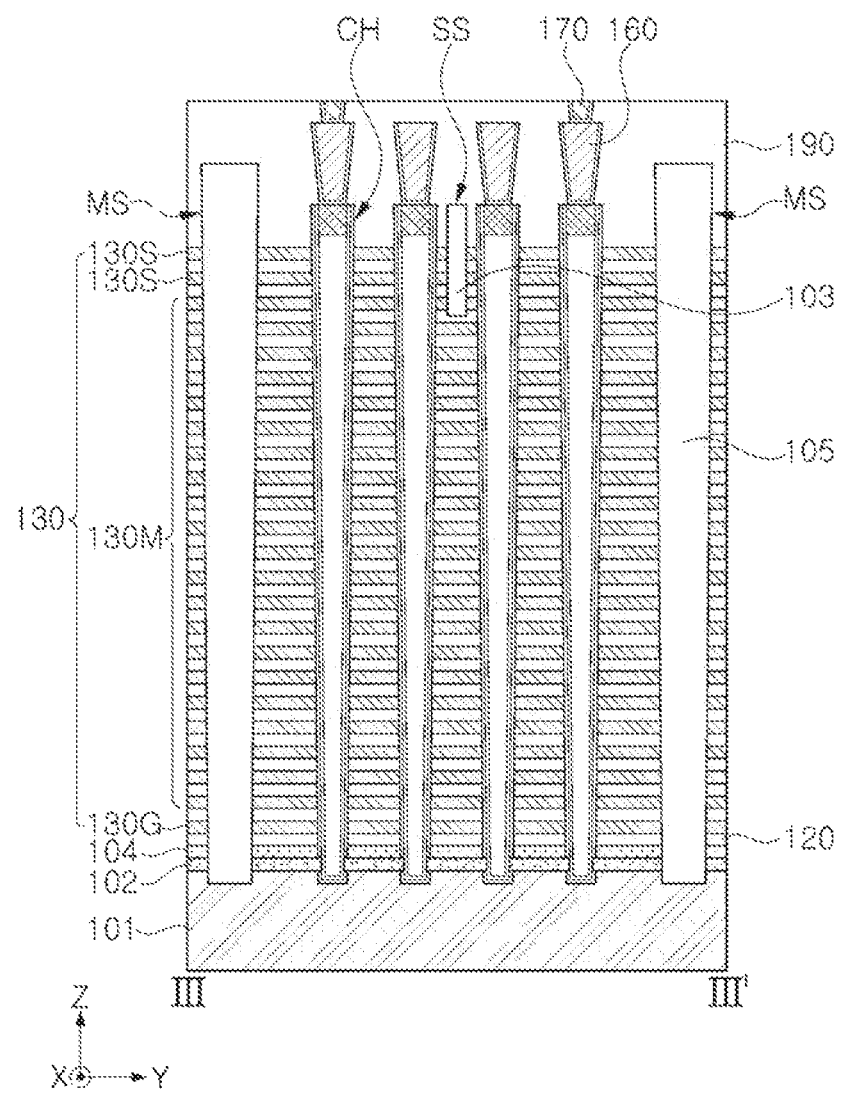

Referring to FIG. 15E, first and second channel contacts 160 and 170 may be formed on the channel structures CH.

The cell region insulating layer 190 may be additionally formed on the separation regions MS. The first and second channel contacts 160 and 170 may be formed by partially removing the cell region insulating layer 190 and filling the conductive material therein. Each of the first and second channel contacts 160 and 170 may include a barrier layer covering the sidewall and the bottom surface, but an example embodiment thereof is not limited thereto.

Thereafter, referring to FIG. 2A, the bit lines 180 may be further formed on the second channel contacts 170, thereby manufacturing the semiconductor device 100.

Figure 16:
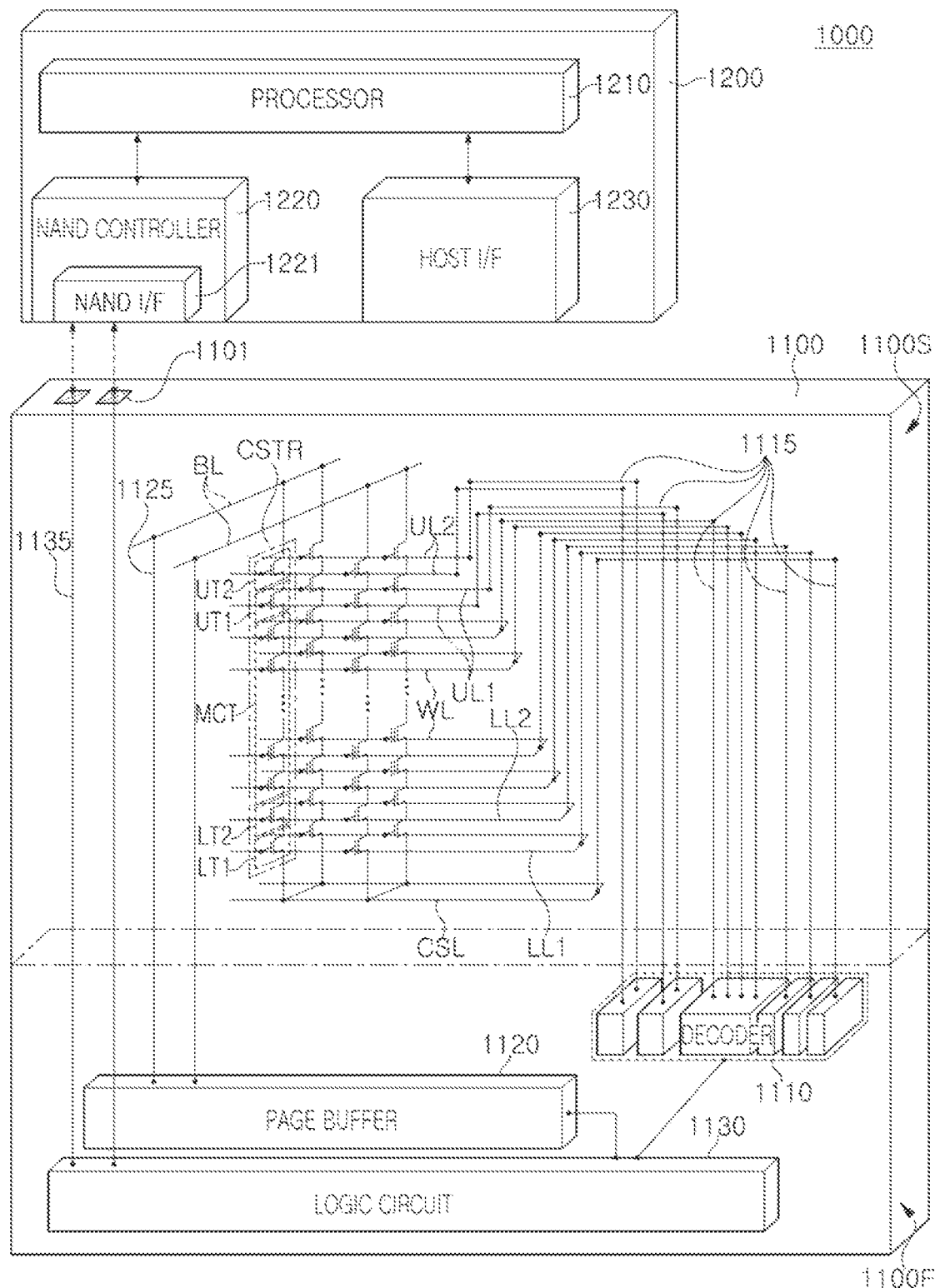
FIG. 16 is a view illustrating a data storage system including a semiconductor device according to an example embodiment of the present invention.

FIG. 16 is a view illustrating a data storage system including a semiconductor device according to an example embodiment.

Referring to FIG. 16, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1A to 14, for example. The semiconductor device 1100 may include a first semiconductor structure 1100F and a second semiconductor structure 1100S on the first semiconductor structure 1100F. In example embodiments, the first semiconductor structure 1100E may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor L12 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the semiconductor structure 1100E to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCI of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 17:
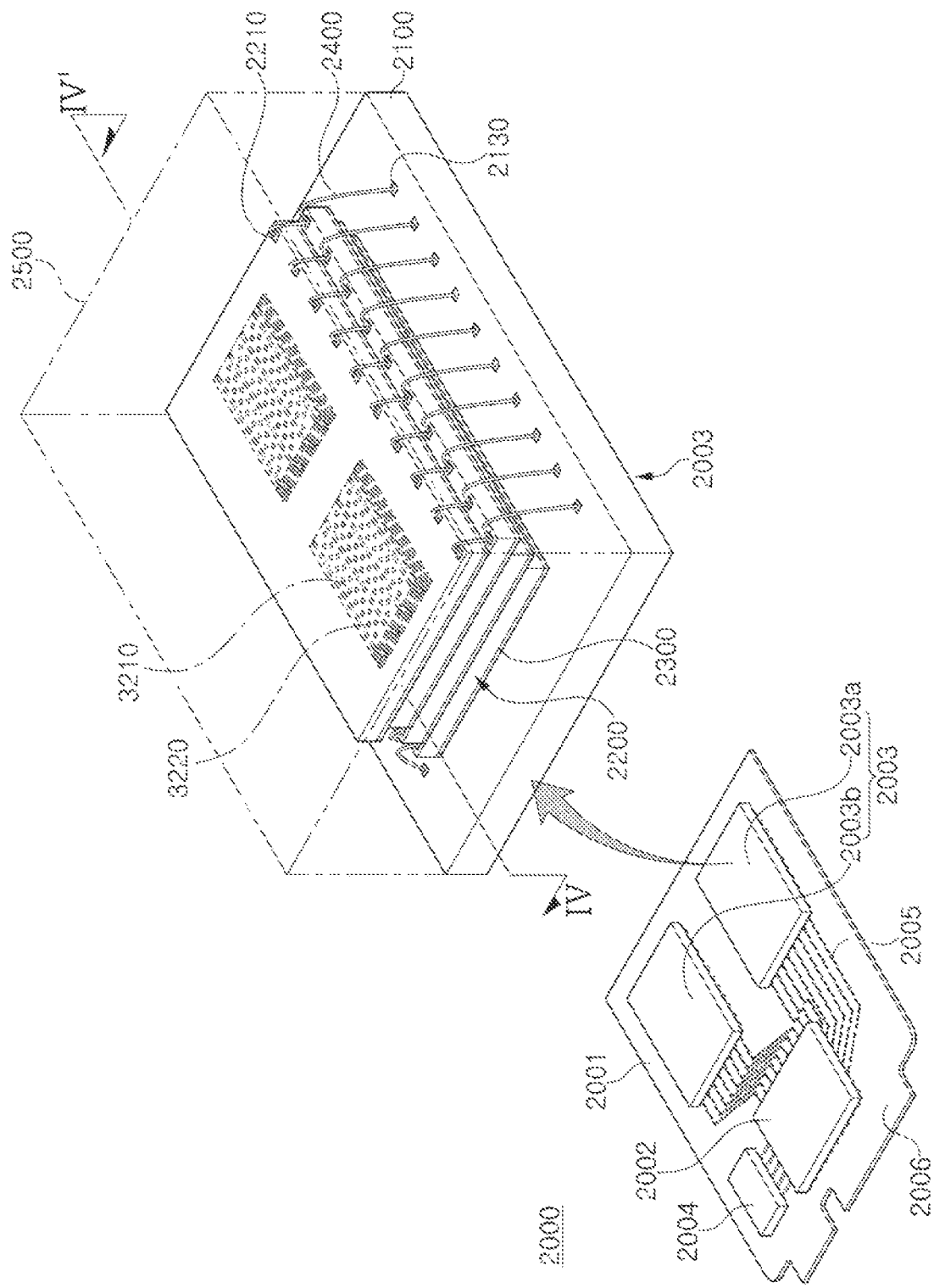
FIG. 17 is a perspective view illustrating a data storage system including a semiconductor device according to an example embodiment of the present invention.

FIG. 17 is a perspective view illustrating a data storage system including a semiconductor device according to an example embodiment.

Referring to FIG. 17, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each of the semiconductor chips 2200 may include an input and output pad 2210. The input and output pad 2210 may correspond to the input and output pad 1101 in FIG. 16. Each of the semiconductor chips 2200 may include gate stack structures 3210 and channel structures 3220. Each of the semiconductor chips 2200 may include the semiconductor device described with reference to FIGS. 1A to 14.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 18:
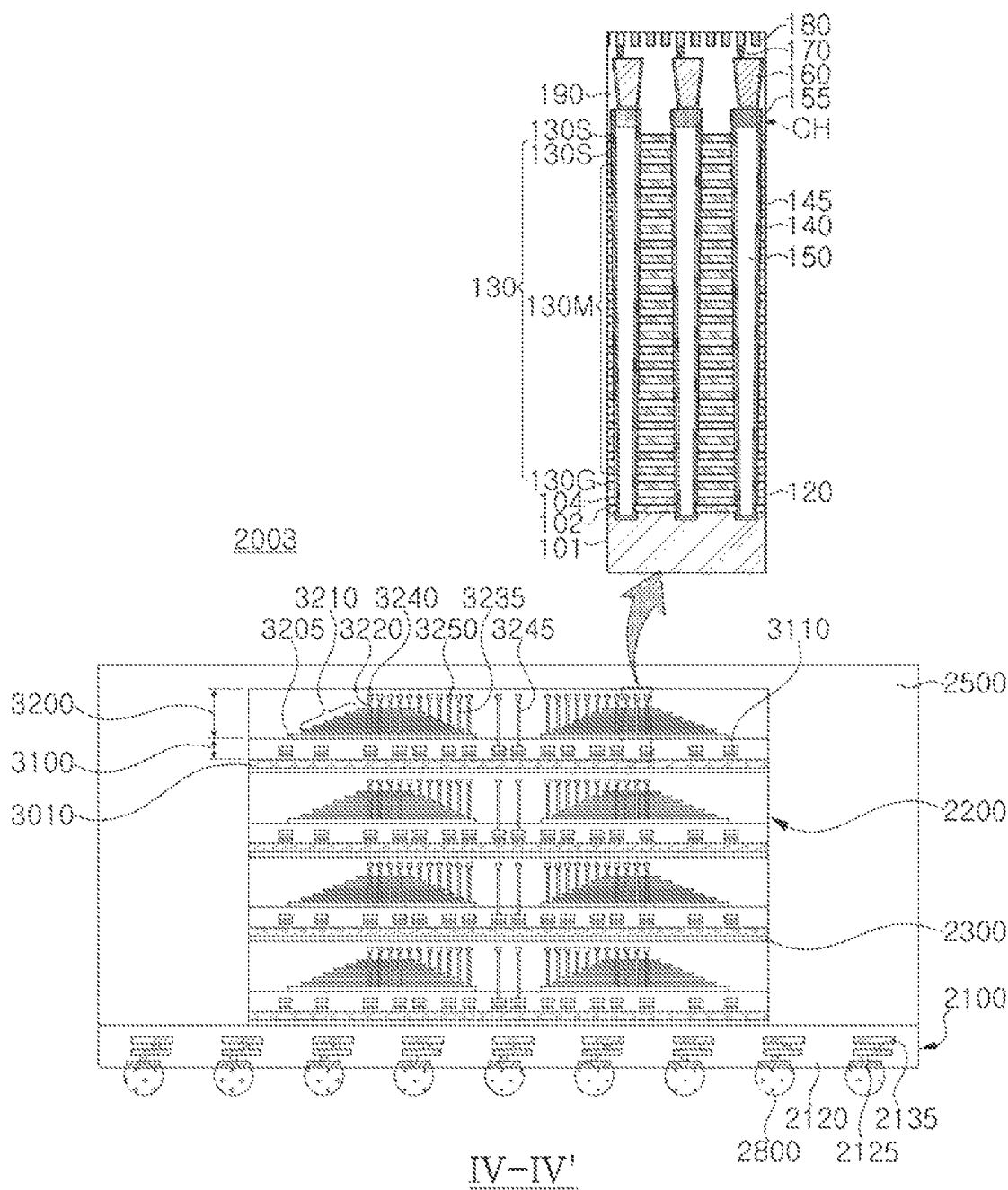
FIG. 18 is a cross-sectional view illustrating a semiconductor package according to an example embodiment of the present invention.

FIG. 18 is a cross-sectional view illustrating a semiconductor device according to an example embodiment, FIG. 18 illustrates an example embodiment of the semiconductor package 2003 in FIG. 17, and illustrates the semiconductor package 2003 in FIG. 17 taken along line IV-IV'.

Referring to FIG. 18, in the semiconductor package 2003, the package substrate 2100 may be configured as a printed circuit board. The package substrate 2100 may include a package substrate body portion 2120, package upper pads 2130 (see FIG. 17) disposed on an upper surface of the package substrate body portion 2120, lower pads 2125 disposed on a lower surface of the package substrate body portion 2120 or exposed through the lower surface, and internal interconnections 2135 electrically connecting the upper pads 2130 to the lower pads 2125 in the package substrate body portion 2120, The upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 17.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation structures 3230 penetrating the gate stack structure 3210, bit lines 3240 electrically connected to the memory channel structures 3220, and contact plugs 3235 electrically connected to the word lines WL (see FIG. 16) of the gate stack structure 3210. As described with reference to FIGS. 1A to 14, in each of the semiconductor chips 2200, channel columns of the channel structures CH may be arranged to have a plurality of pitches in a direction perpendicular to a direction in which the bit lines 180 extend longitudinally.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed on an external side of the gate stack structure 3210, and may be further disposed to penetrate (e.g., extend through) the gate stack structure 3210. Each of the semiconductor chips 2200 may further include an input and output pad 2210 (see FIG. 17) electrically connected to the peripheral interconnections 3110 of the first semiconductor structure 3100.

According to the aforementioned example embodiments, by diversifying the spacing between columns of the channel structure in a direction perpendicular to the bit line and disposing the upper interconnection structure accordingly, a semiconductor device having mass productivity and reliability and a data storage system including the same may be provided.

While the example embodiments have been illustrated and described above, it will be apparent to those skilled in the art that modifications and variations could be made without departing from the scope of the present invention as defined by the appended claims.

What is claimed is:

1. A semiconductor device comprising:
   a substrate;
   gate electrodes stacked and spaced apart from each other in a first direction perpendicular to an upper surface of the substrate;
   separation regions in the gate electrodes, extending in a second direction that is perpendicular to the first direction, and spaced apart from each other in a third direction that is perpendicular to the first direction and the second direction;
   an upper separation region extending in the second direction between two of the separation regions adjacent to each other in the third direction and penetrating a portion of the gate electrodes including an uppermost gate electrode;
   channel structures in the gate electrodes between the two of the separation regions and each including a channel layer;
   first channel contacts on the channel structures, respectively;
   second channel contacts electrically connected to the first channel contacts, respectively; and
   bit lines electrically connected to the second channel contacts, respectively, and extending in the third direction,
   wherein the channel structures are arranged in first, second, third, fourth, and fifth channel columns that are adjacent to each other and are sequentially arranged in the second direction,
   wherein the first channel column and the second channel column are arranged with a first pitch, the second channel column and the third channel column are arranged with a second pitch different from the first pitch, the third channel column and the fourth channel column are arranged with the second pitch, and the fourth channel column and the fifth channel column are arranged with the first pitch,
   wherein the bit lines are arranged with a third pitch in the second direction,
   wherein a sum of the first pitch and the second pitch is n times the third pitch, where n is a natural number, and
   wherein the sum of the first pitch and the second pitch is four times the third pitch.

2. The semiconductor device of claim 1, wherein the first channel contacts are arranged in first channel contact columns that extend in the third direction, and the first channel contact columns are arranged with a fourth pitch that is smaller than the first pitch and is greater than the second pitch in the second direction.

3. The semiconductor device of claim 1, wherein the first channel contacts are arranged in first channel contact columns that extend in the third direction, three of the first channel contact columns are arranged with the first pitch and the second pitch in the second direction, and the three of the first channel contact columns are aligned with the first to third channel columns, respectively.

4. The semiconductor device of claim 1, wherein the second channel contacts are arranged in second channel contact columns that extend in the third direction, and the second channel contact columns are arranged with the third pitch in the second direction.

5. The semiconductor device of claim 1, wherein the second channel contacts are arranged in second channel contact columns in the third direction, and the second channel contact columns are arranged with different pitches in the second direction.

6. The semiconductor device of claim 1, wherein a difference between the first pitch and the second pitch is in a range of about 0.2 nm to about 20 nm.

7. The semiconductor device of claim 1, wherein at least two of the channel structures in the first channel column are shifted relative to each other in the second direction.

8. The semiconductor device of claim 7, wherein the channel structures in the first channel column are arranged symmetrically with respect to the upper separation region.

9. The semiconductor device of claim 1,
   wherein the channel structures further have a sixth channel column, and the first channel column is between the sixth channel column and the second channel column, and
   wherein the sixth channel column and the first channel column are arranged with the second pitch.

10. The semiconductor device of claim 1, wherein, among the channel structures in the second channel column, channel structures in rows that are closest to the separation regions are offset by a first length from a center line between the second channel column and the third channel column toward the first channel column.

11. The semiconductor device of claim 10, wherein, among the channel structures in the second channel column, channel structures in rows that are closest to the upper separation region are offset from the center line between the second channel column and the third channel column toward the first channel column by a second length that is smaller than the first length, or are offset toward the third channel column.

12. The semiconductor device of claim 1, further comprising:
   circuit devices that are below the substrate and electrically connected to the gate electrodes and the channel structures.

13. A semiconductor device comprising:
   a substrate;
   gate electrodes stacked and spaced apart from each other in a first direction that is perpendicular to an upper surface of the substrate;
   separation regions in the gate electrodes, extending in a second direction that is perpendicular to the first direction, and spaced apart from each other in a third direction that is perpendicular to the first direction and the second direction;
   channel structures that are arranged in columns that extend in the third direction, are arranged in rows that extend in the second direction, and are in the gate electrodes between the separation regions; and
   bit lines extending in the third direction on the channel structures,
   wherein the channel structures are arranged in first, second, third, fourth, and fifth channel columns that are adjacent to each other and are sequentially arranged in the second direction,
   wherein the first, second, and third channel columns comprise a first group of channel structures, the first channel column and the second channel column are arranged with a first pitch, and the second channel column and the third channel column are arranged with a second pitch that is smaller than the first pitch, the third channel column and the fourth channel column are arranged with the second pitch, and the fourth channel column and the fifth channel column are arranged with the first pitch, wherein a row of the channel structures is configured as a row of dummy channel structures that intersect with an electrically insulating upper separation region, which extends between two of the separation regions and penetrates a portion of the gate electrodes including an uppermost one of the gate electrodes, and wherein the bit lines are arranged with at least one pitch smaller than the second pitch in the second direction.

14. The semiconductor device of claim 13, wherein the bit lines are arranged with three different pitches on the first group of channel structures.

15. The semiconductor device of claim 14, wherein the bit lines are arranged with a third pitch, a fourth pitch greater than the third pitch, the third pitch, a fifth pitch smaller than the third pitch, and the third pitch in order along the second direction on the first group of channel structures.

16. The semiconductor device of claim 13, wherein the bit lines electrically connected to the first group of channel structures are arranged with a third pitch, and a sum of the first pitch and the second pitch is n times the third pitch, where n is a natural number.

17. A data storage system comprising:
- a semiconductor storage device including a substrate, circuit devices on one side of the substrate, and an input/output pad electrically connected to the circuit devices; and
- a controller electrically connected to the semiconductor storage device through the input/output pad and configured to control the semiconductor storage device, wherein the semiconductor storage device includes:
- gate electrodes stacked and spaced apart from each other in a first direction that is perpendicular to an upper surface of the substrate;
- separation regions in the gate electrodes, extending in a second direction that is perpendicular to the first direction, and spaced apart from each other in a third direction that is perpendicular to the first direction and the second direction;
- channel structures that are arranged in columns that extend in the third direction, are arranged in rows that extend in the second direction, and are in the gate electrodes between the separation regions; and
- bit lines extending in the third direction on the channel structures, wherein the channel structures are arranged in first, second, third, fourth, and fifth channel columns that are adjacent to each other and are sequentially arranged in the second direction, wherein the first channel column and the second channel column are arranged with a first pitch, the second channel column and the third channel column are arranged with a second pitch different from the first pitch, the third channel column and the fourth channel column are arranged with the second pitch, and the fourth channel column and the fifth channel column are arranged with the first pitch, wherein the bit lines are arranged with a third pitch in the second direction, and wherein a sum of the first pitch and the second pitch is four times the third pitch.

18. The semiconductor device of claim 1, wherein the first and third channel columns include first and third dummy channel structures, respectively, which contact the upper separation region.

19. The data storage system of claim 17, wherein a row of the channel structures is configured as a row of dummy channel structures that intersect with an electrically insulating upper separation region, which extends between two of the separation regions and penetrates a portion of the gate electrodes including an uppermost one of the gate electrodes.

* * * * *